US012076879B2

(12) United States Patent
Kojima et al.

(10) Patent No.: US 12,076,879 B2
(45) Date of Patent: Sep. 3, 2024

(54) METHOD OF PROCESSING WORKPIECE

(71) Applicant: DISCO CORPORATION, Tokyo (JP)

(72) Inventors: Yoshimasa Kojima, Tokyo (JP); Atsushi Kubo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 260 days.

(21) Appl. No.: 17/649,123

(22) Filed: Jan. 27, 2022

(65) Prior Publication Data
US 2022/0258369 A1 Aug. 18, 2022

(30) Foreign Application Priority Data

Feb. 15, 2021 (JP) ................................. 2021-021725

(51) Int. Cl.
*B26D 5/00* (2006.01)
*B26D 3/06* (2006.01)

(52) U.S. Cl.
CPC ............. *B26D 5/005* (2013.01); *B26D 3/065* (2013.01)

(58) Field of Classification Search
CPC . B26D 5/005; B26D 3/06; B26D 3/08; B26D 3/065; H01L 21/78; B23K 26/364; B23K 210/40; Y10T 83/0304
See application file for complete search history.

(56) References Cited

U.S. PATENT DOCUMENTS

2007/0029684 A1* 2/2007 Arai .................. H01L 21/67092
438/432
2009/0102042 A1* 4/2009 Uoya ...................... H01L 24/27
438/460
2016/0136843 A1* 5/2016 Katoh .................. B28D 5/0064
125/14
2017/0148759 A1* 5/2017 Hayata ..................... H01L 24/83
2018/0019139 A1* 1/2018 Sun ........................ G03F 9/7084
2019/0035689 A1* 1/2019 Yamamoto .......... H01L 21/3043
(Continued)

FOREIGN PATENT DOCUMENTS

JP 2006140341 A 6/2006
JP 2010087141 * 4/2010 ........... H01L 21/301
JP 2010087141 A 4/2010

OTHER PUBLICATIONS

Search report issued in counterpart Singapore patent application No. 10202200896P, Apr. 18, 2023.

*Primary Examiner* — Evan H Macfarlane
*Assistant Examiner* — Fernando A Ayala
(74) *Attorney, Agent, or Firm* — Greer, Burns & Crain, Ltd.

(57) ABSTRACT

A method of processing a workpiece includes holding a face side of the workpiece on a holding table having a region made of a transparent material and forming a processed groove in the workpiece with a cutting blade. The forming a processed groove includes capturing an image of the processed groove on a reverse side and the face side of the workpiece, and detecting whether a position of a first central line of the processed groove on the reverse side and a position of a second central line of the processed groove on the face side are in conformity in a predetermined plane. If the positions of the first and second central lines are not in conformity, then the forming a processed groove further has correcting a position of the center of the cutting blade in order to bring the positions of the first and second central lines into conformity.

10 Claims, 16 Drawing Sheets

(56) References Cited

U.S. PATENT DOCUMENTS

| | | | |
|---|---|---|---|
| 2019/0229005 A1* | 7/2019 | Tanaka | H01L 21/681 |
| 2019/0318948 A1* | 10/2019 | Che | H01L 21/67748 |
| 2020/0243367 A1* | 7/2020 | Seddon | H01L 21/681 |
| 2020/0335377 A1 | 10/2020 | Masuda et al. | |
| 2022/0115242 A1* | 4/2022 | Jin | H01L 21/0337 |

* cited by examiner

METHOD OF PROCESSING WORKPIECE

BACKGROUND OF THE INVENTION

Field of the Invention

The present invention relates to a method of processing a workpiece whose face side is held on a holding table having a region made of a material that is transparent to visible light.

Description of the Related Art

Device chips are used in electronic appliances such as mobile phones and personal computers. The device chips are manufactured by dividing workpieces such as silicon wafers having, on their face sides, a plurality of devices such as integrated circuits (ICs), large-scale-integration (LSI) circuits, and microelectromechanical systems (MEMS) or the like formed thereon. Specifically, for example, the reverse side of such a workpiece is ground by a grinding apparatus until the workpiece is thinned down to a predetermined thickness. Thereafter, the workpiece is divided into individual device chips when it is cut along projected dicing lines thereon by a cutting apparatus having a cutting unit and a chuck table.

As devices have been diversified in recent years, there is known a cutting method for cutting a workpiece along projected dicing lines thereon while a face side of the workpiece where devices are formed is facing downwardly and held under suction on a chuck table (see, for example, JP2006-140341A). Normally, alignment marks used in detecting the positions of the projected dicing lines are formed on the face side of such a workpiece. Therefore, in a case where the face side of the workpiece is held under suction on the chuck table with the reverse side thereof being exposed upwardly, it is necessary to place a camera unit capable of capturing workpiece images with infrared radiation and capture an image of the face side of the workpiece through the reverse side thereof with the camera unit disposed above the workpiece.

There has been known a cutting apparatus including a chuck table that is transparent to visible light and a camera unit disposed below the chuck table for capturing workpiece images with visible light (see, for example, JP2010-87141A). Even when the face side of a workpiece is held under suction on the chuck table, the cutting apparatus allows the camera unit to capture an image of the face side of the workpiece with visible light through the chuck table. Therefore, the cutting apparatus can align the workpiece on the chuck table with a cutting unit on the basis of the image captured by the camera unit without using an infrared camera unit.

In a case where a workpiece to be cut is made of a hard material or is relatively thick, there has been used a cutting method called a stepped cutting method that cuts the workpiece stepwise by incising the workpiece a plurality of times along each of projected dicing lines established on the face side of the workpiece. According to the ordinary stepped cutting method, the reverse side of the workpiece is held under suction on a chuck table made of porous ceramic or the like such that the face side of the workpiece is exposed upwardly. Then, the workpiece is aligned with a cutting unit with use of a camera unit on the basis of an image captured of the faces side of the workpiece by a visible-light camera disposed above the workpiece, and the projected dicing lines on the workpiece are oriented substantially parallel to the direction in which the workpiece and the cutting unit are to be processing-fed relatively to each other.

Then, a first cutting blade cuts the workpiece along the projected dicing lines, forming first processed grooves in the workpiece along the projected dicing lines to a predetermined depth short of the thickness of the workpiece, i.e., not dividing the workpiece. Thereafter, a second cutting blade thinner than the first cutting blade cuts the bottoms of the first processed grooves in the workpiece, forming second processed grooves narrower than the first processed grooves in the workpiece along the projected dicing lines to a depth large enough to reach the reverse side of the workpiece. According to the stepped cutting method, therefore, the workpiece is divided by the first processed grooves that are formed in the workpiece closer to the face side thereof and the second processed grooves that are formed in the workpiece closer to the reverse side thereof. However, when the camera unit captures an image of the processed grooves in the workpiece from above the workpiece, the image does not include the second processed grooves that are positioned closer to the reverse side of the workpiece. Consequently, it is not possible to confirm from the captured image whether or not the widthwise central lines of the first processed grooves and the widthwise central lines of the second processed grooves are in conformity with each other.

SUMMARY OF THE INVENTION

It is therefore an object of the present invention to provide a method of processing a workpiece to cut the workpiece with processed grooves along projected dicing lines on the workpiece such that the widthwise central lines of first processed grooves cut in the workpiece and the widthwise central lines of second processed grooves cut in the workpiece are in conformity with each other.

In accordance with an aspect of the present invention, there is provided a method of processing a workpiece, the method including a holding step of holding a face side of the workpiece on a holding table having a region made of a transparent material while a reverse side of the workpiece is being exposed, and a processed groove forming step of forming a processed groove in the workpiece by cutting the workpiece held on the holding table with a cutting blade, in which the processed groove forming step includes a first image capturing step of capturing an image of the processed groove on the reverse side of the workpiece, a second image capturing step of capturing an image of the processed groove on the face side of the workpiece through the holding table, and a detecting step of detecting whether or not a position of a first central line of the processed groove whose image has been captured in the first image capturing step and a position of a second central line of the processed groove whose image has been captured in the second image capturing step are in conformity with each other in a predetermined plane, and if the position of the first central line and the position of the second central line are not in conformity with each other in the predetermined plane in the detecting step, then the processed groove forming step further has a correcting step of correcting a position of a center of the cutting blade in order to bring the position of the first central line and the position of the second central line into conformity with each other.

The processed groove forming step may include a first processed groove forming step of forming a first processed groove in the workpiece, the first processed groove having a predetermined depth short of the face side, with a first cutting blade having a first thickness, and a second processed groove forming step of positioning a second cutting blade that has a second thickness at the first processed groove and forming a second processed groove in the workpiece along the first processed groove, the second processed groove extending to the face side, thereby dividing the workpiece.

The second cutting blade may be smaller in edge thickness than the first cutting blade.

The first image capturing step may include capturing an image of the first processed groove on the reverse side with visible light using a first image capturing unit disposed above the workpiece, the second image capturing step may include capturing an image of the second processed groove on the face side with visible light through the holding table using a second image capturing unit disposed below the workpiece, and the detecting step may include detecting whether or not a position of a first central line of the first processed groove on the reverse side and a position of a second central line of the second processed groove on the face side are in conformity with each other in the predetermined plane.

The first image capturing step may include capturing an image of the first processed groove on the reverse side with infrared radiation through the holding table using a third image capturing unit disposed below the workpiece, the second image capturing step may include capturing an image of the second processed groove on the face side with infrared radiation through the holding table using the third image capturing unit, and the detecting step may include detecting whether or not the position of the first central line of the first processed groove on the reverse side and the position of the second central line of the second processed groove on the face side are in conformity with each other in the predetermined plane.

In the method of processing the workpiece according to the aspect of the present invention, an image of the processed groove on the reverse side of the workpiece is captured (first image capturing step), and an image of the processed groove on the face side of the workpiece is captured (second image capturing step). Then, it is detected whether or not the position of the first central line of the processed groove whose image has been captured in the first image capturing step and the position of the second central line of the processed groove whose image has been captured in the second image capturing step are in conformity with each other in the predetermined plane (detecting step). If the position of the first central line and the position of the second central line are not in conformity with each other in the predetermined plane, then the position of the center of the cutting blade is corrected in order to bring the position of the first central line and the position of the second central line into conformity with each other (correcting step). In a subsequent cutting process, therefore, the widthwise center of the processed groove on the reverse side of the workpiece and the widthwise center of the processed groove on the face side of the workpiece are kept in conformity with each other.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
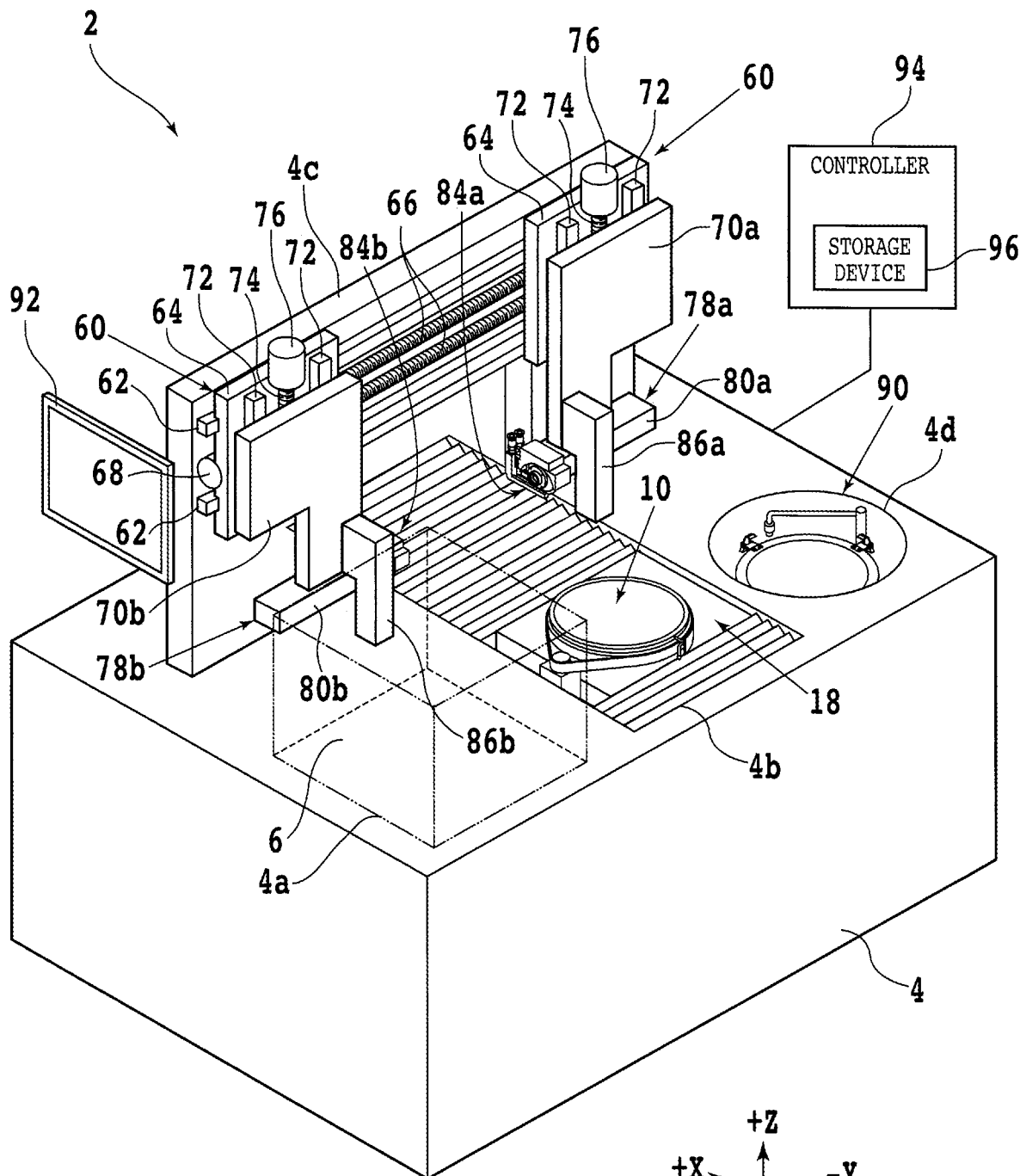
FIG. 1 is a perspective view of a cutting apparatus that carries out a method of processing a workpiece according to an embodiment of the present invention.
Figure 1:
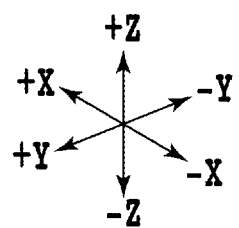

Preferred embodiments of the present invention will be described below with reference to the accompanying drawings. FIG. 1 illustrates in perspective a cutting apparatus 2 according to a first embodiment of the present invention. In FIG. 1, some components of the cutting apparatus 2 are illustrated in block form. In FIG. 1, the cutting apparatus 2 is illustrated in an XYZ coordinate system including X-axis directions, i.e., processing feed directions, Y-axis directions, i.e., indexing feed directions, and Z-axis directions, i.e., vertical directions, which extend perpendicularly to each other. The X-axis directions include a +X direction and a −X direction that are opposite each other, the Y-axis directions include a +Y direction and a −Y direction that are opposite each other, and Z-axis directions include a +Z direction and a −Z direction that are opposite each other.

The cutting apparatus 2 includes a base 4 supporting its components thereon. The base 4 has an opening 4a defined in a front corner thereof positioned in a forward direction, i.e., the +Y direction. The opening 4a houses therein a cassette elevator. The cassette elevator has an upper surface on which there is disposed a cassette 6 for housing workpieces 11 (see FIG. 2). Each of the workpieces 11 includes a wafer shaped as a circular plate made of a semiconductor material such as silicon, for example. However, the workpiece 11 is not limited to any particular material, shape, structure, size, etc. The workpiece 11 may alternatively be made of any of materials including other semiconductor, ceramic, resin, metal, etc.

Figure 2:
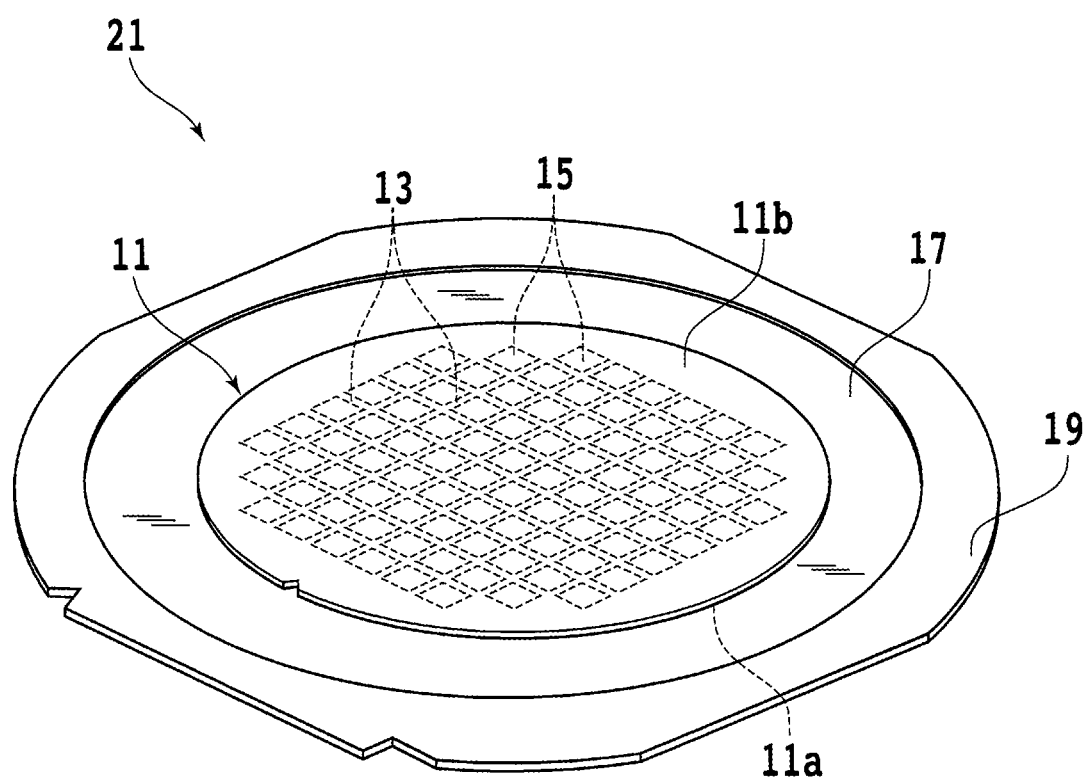
FIG. 2 is a perspective view of a workpiece unit to be handled by the cutting apparatus.

As illustrated in FIG. 2, the workpiece 11 has a plurality of intersecting projected dicing lines or streets 13 established on a face side 11a thereof. The projected dicing lines 13 demarcate a plurality of areas on the face side 11a in which respective devices 15 such as ICs, an alignment mark, not illustrated, etc. are formed. A tape, i.e., a dicing tape, 17 that is larger in diameter than the workpiece 11 is affixed to the face side 11a. The tape 17 has a layered structure including a base layer and an adhesive layer, i.e., a glue layer, and is made of a transparent material through which a radiation in a predetermined wavelength band, e.g., visible light, infrared rays, or the like can be transmitted.

The base layer is made of polyolefin (PO) or the like, for example. The adhesive layer is made of adhesive resin such as ultraviolet (UV)-curable adhesive resin. The adhesive layer of the tape 17 is affixed to the face side 11a of the workpiece 11. An annular frame 19 of metal is affixed to an outer circumferential portion of the tape 17, making up a workpiece unit 21 where the workpiece 11 is supported on the frame 19 by the tape 17. Workpieces 11 are housed as workpiece units 21 in the cassette 6. FIG. 2 illustrates the workpiece unit 21 in perspective.

As illustrated in FIG. 1, the base 4 also has an oblong rectangular opening 4b defined behind the opening 4a in the −Y direction and having longer sides extending along the X-axis directions. A chuck table, i.e., a holding table, 10 shaped as a circular plate is disposed in the opening 4b. An annular suction plate, not illustrated, having a plurality of suction ports defined therein along the circumferential directions thereof is disposed on an outer circumferential portion of the chuck table 10. The chuck table 10 and other components associated therewith will be described in further detail below with reference to FIGS. 3 through 6.

Figure 3:
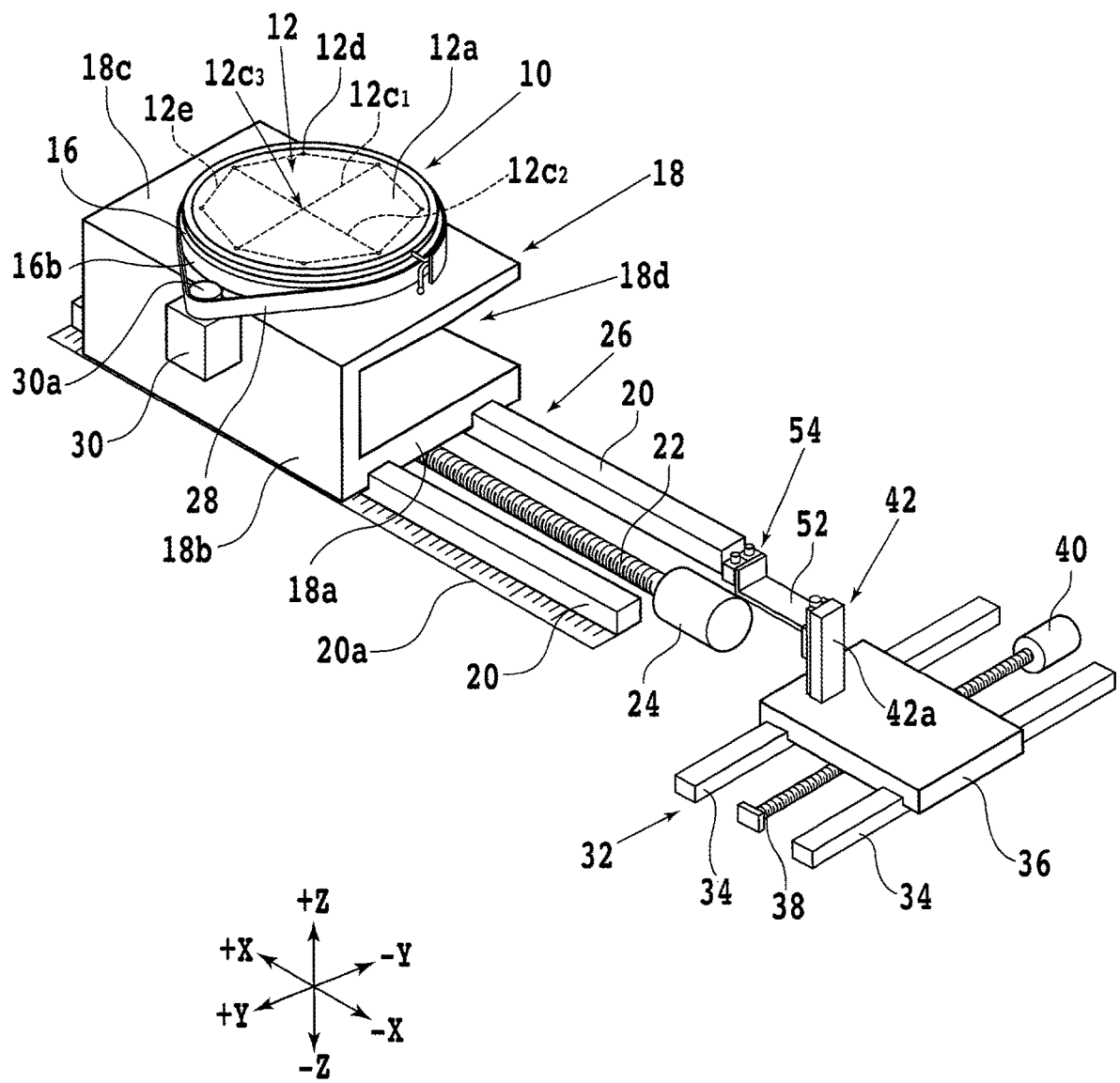
FIG. 3 is a perspective view of a chuck table of the cutting apparatus.
Figure 4:
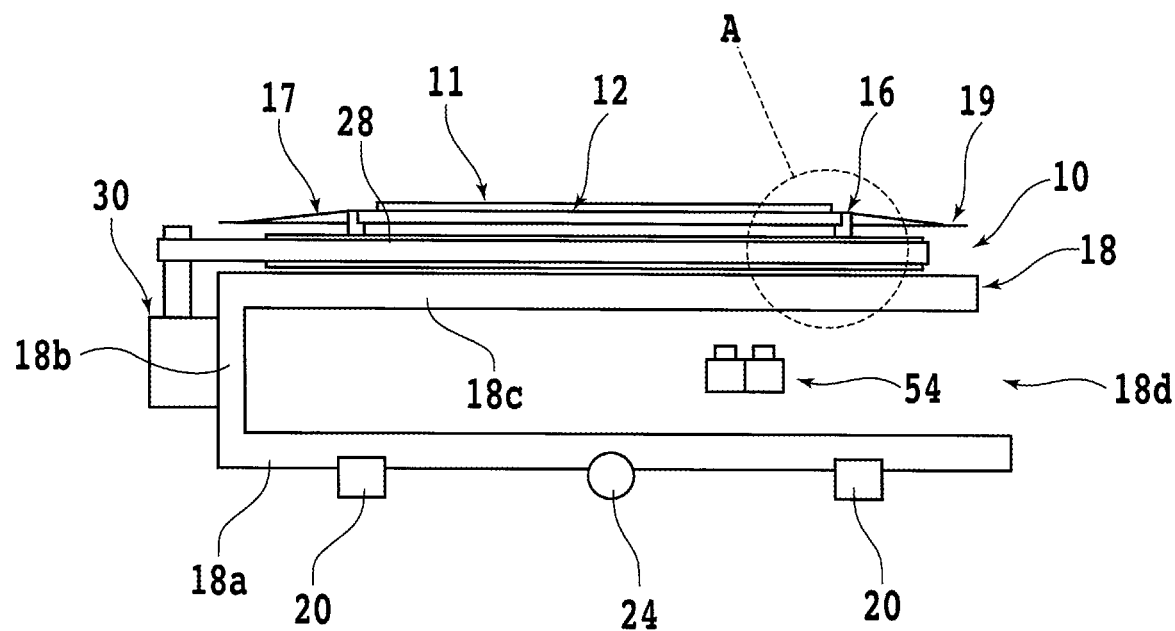
FIG. 4 is a side elevational view, partly in cross section, of the chuck table.
Figure 5:
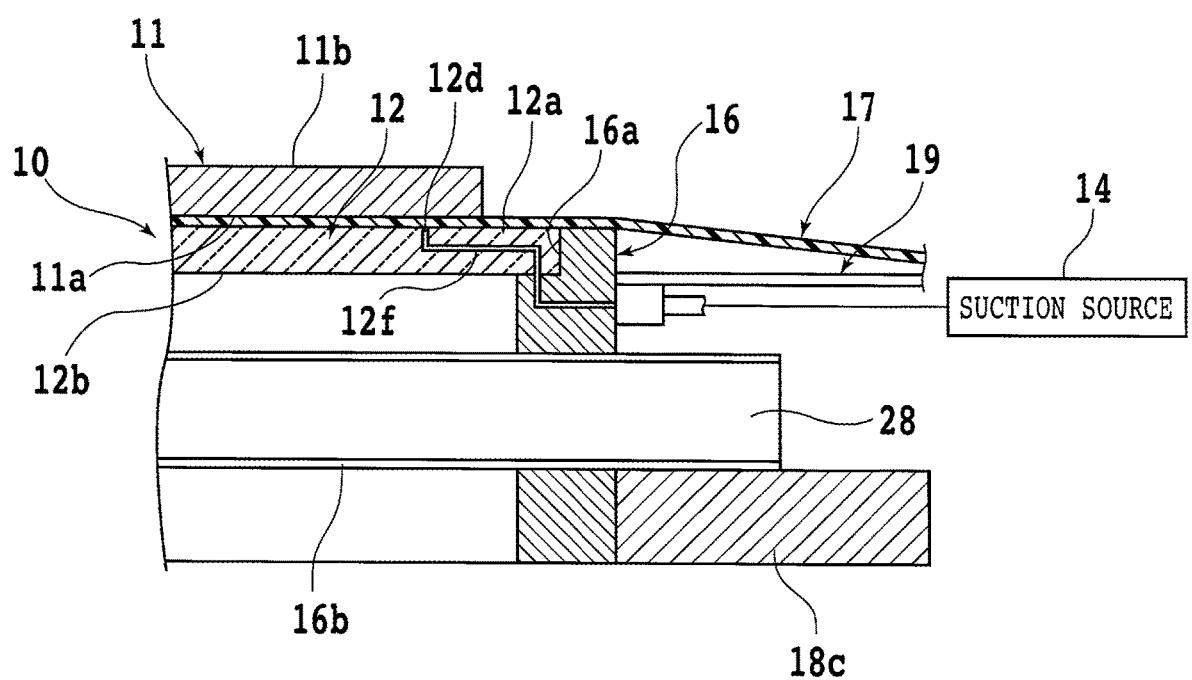
FIG. 5 is an enlarged cross-sectional view of a section A in FIG. 4.

FIG. 3 illustrates the chuck table 10 in perspective. FIG. 4 illustrates the chuck table 10 in side elevation partly in cross section. In FIG. 4, the hatching is omitted from illustration for convenience sake. FIG. 5 illustrates a section A in FIG. 4 in enlarged cross section. In FIG. 5, a component is illustrated in block form. The chuck table 10 has a holding member 12 shaped as a circular plate. The holding member 12 includes a substantially flat surface 12a and another substantially flat surface 12b positioned opposite the surface 12a. The holding member 12 is made of a transparent material that transmits visible light and infrared rays, e.g., near infrared rays, therethrough. The holding member 12 is made of quartz glass, borosilicate glass, or soda glass, though it may be made of calcium fluoride, lithium fluoride, or magnesium fluoride.

The holding member 12 has a plurality of fluid channels defined therein. Specifically, the fluid channels include a straight first suction channel $12c_1$ extending diametrically across the holding member 12 through the central axis of the circular plate thereof, as viewed in plan along the Z-axis directions, and a straight second suction channel $12c_2$ extending diametrically across the holding member 12 through the central axis of the circular plate thereof perpendicularly to the first suction channel $12c_1$ in a plane parallel to the surface 12a. The first suction channel $12c_1$ and the second suction channel $12c_2$ are connected to each other at a point $12c_3$ positioned at the central axis of the circular plate. The holding member 12 also has a plurality of openings 12d defined in an outer circumferential portion thereof at circumferentially spaced intervals. The openings 12d have upper ends open at the surface 12a and extend from the surface 12a to a predetermined depth in the holding member 12 where the openings 12d terminate short of the other surface 12b.

Some of the openings 12d are defined respectively at both ends of the first suction channel $12c_1$ and both ends of the second suction channel $12c_2$ and are connected thereto. The openings 12d are interconnected in circumferential directions of the holding member 12 by an outer circumferential suction channel 12e defined in an outer circumferential portion of the holding member 12 at the predetermined depth. The openings 12d are also connected to a suction channel 12f (see FIG. 5) defined in the holding member 12 and extending radially outwardly. A suction source 14 (see FIG. 5) such as an ejector is connected to the suction channel 12f. When the suction source 14 is actuated, it generates a negative pressure that acts in the openings 12d through the suction channel 12f. Therefore, the surface 12a of the holding member 12 where the openings 12d are open functions as a holding surface for holding the workpiece unit 21, i.e., the workpiece 11, under suction thereon.

The fluid channels in the holding member 12, which include the first suction channel $12c_1$, the second suction channel 12c2, the openings 12d, the outer circumferential suction channel 12e, and the suction channel 12f, disperse or reflect light that is applied to the holding member 12. Therefore, the fluid channels in the holding member 12, as they are viewed from the surface 12a or the surface 12b, may not be completely transparent to visible light, but may be transmissive of light or may be opaque to light. However, regions of the holding member 12 except these fluid channels are transparent from the surface 12a to the surface 12b. Specifically, four regions of the holding member 12 that are divided by the first suction channel $12c_1$ and the second suction channel $12c_2$ and that are positioned radially inwardly of the outer circumferential suction channel 12e are transparent from the surface 12a to the surface 12b.

A hollow cylindrical frame 16 made of a metal material such as stainless steel is disposed on an outer circumferential surface of the holding member 12. The frame 16 has an opening 16a (see FIG. 5) defined in an upper portion thereof. The holding member 12 is disposed on the frame 16 in covering relation to the surface 12a. As illustrated in FIGS. 3 and 4, the frame 16 is supported on an X-axis movable table 18. The X-axis movable table 18 includes a horizontal bottom plate 18a that is of a rectangular shape as viewed along the Z-axis directions. The X-axis movable table 18 also includes a vertical side plate 18b that is of a rectangular shape as viewed along the Y-axis directions and that has a lower end joined to a front end of the bottom plate 18a in the +Y direction.

A top plate 18c that is of a rectangular shape as viewed along the Z-axis directions as with the bottom plate 18a and that has a front end joined to an upper end of the side plate 18b. The bottom plate 18a, the vertical side plate 18b, and the top plate 18c jointly define a space 18d therebetween that is open at a rear end thereof in the −Y direction and also at both side ends thereof in the X-axis directions. The bottom plate 18a is slidable on and along a pair of X-axis guide rails 20 disposed below the bottom plate 18a in the −Z direction and extending generally parallel to each other in the X-axis directions. The X-axis guide rails 20 are fixedly mounted on an upper surface of a stationary base, not illustrated. An X-axis linear scale 20a is disposed adjacent to the X-axis guide rails 20.

A reading head, not illustrated, is mounted on a lower surface of the X-axis movable table 18. The reading head reads graduations of the X-axis linear scale 20a for the calculation of the position or coordinate in the X-axis directions of the X-axis movable table 18 and the distance that the X-axis movable table 18 has moved in the X-axis directions. A nut, not illustrated, is mounted on a lower surface of the bottom plate 18a of the X-axis movable table 18 and is operatively threaded over an X-axis ball screw 22 disposed between and extending generally parallel to the X-axis guide rails 20. The X-axis ball screw 22 has an end coupled to an X-axis stepping motor 24.

When the X-axis stepping motor 24 is energized, it rotates the X-axis ball screw 22 about its central axis, causing the nut to move the X-axis movable table 18 in one of the X-axis directions along the X-axis guide rails 20. The X-axis movable table 18, the X-axis guide rails 20, the X-axis ball screw 22, the X-axis stepping motor 24, etc. jointly make up an X-axis moving mechanism 26 for moving the X-axis movable table 18 along the X-axis guide rails 20. The frame 16 is rotatably supported on an upper surface of the top plate 18c of the X-axis movable table 18 for rotation about a central axis generally parallel to the Z-axis directions. The frame 16 includes a pulley portion 16b defined by a cylindrical side surface thereof. The pulley portion 16b of the frame 16 that is supported on the X-axis movable table 18 is positioned above the top plate 18c thereof.

A rotary actuator 30 such as an electric motor is mounted on the side plate 18b of the X-axis movable table 18. The rotary actuator 30 has a rotational shaft with a pulley 30a mounted thereon. An endless belt 28 is wound around the pulley 30a and the pulley portion 16b. When the rotary actuator 30 is energized, it rotates its rotational shaft, rotating the pulley 30a to move the endless belt 28 to rotate the frame 16 and hence the chuck table 10 about their central axis generally parallel to the Z-axis directions. By controlling the rotation of the pulley 30a, it is possible to turn the chuck table 10 through a desired angle about the central axis.

A Y-axis moving mechanism 32 for moving a lower image capturing unit 54, to be described later, in the Y-axis directions is disposed on an extension of the X-axis moving mechanism 26 in the X-axis directions. The Y-axis moving mechanism 32 includes a pair of Y-axis guide rails 34 extending generally parallel to each other in the Y-axis directions. The Y-axis guide rails 34 are fixedly mounted on the upper surface of the stationary base, not illustrated. A Y-axis movable table 36 is slidable on and along the Y-axis guide rails 34. A nut, not illustrated, is mounted on a lower surface of the Y-axis movable table 36 and is operatively threaded over a Y-axis ball screw 38 disposed between and extending generally parallel to the Y-axis guide rails 34.

The Y-axis ball screw 38 has an end coupled to a Y-axis stepping motor 40. When the Y-axis stepping motor 40 is energized, it rotates the Y-axis ball screw 38 about its central axis, causing the nut to move the Y-axis movable table 36 in one of the Y-axis directions along the Y-axis guide rails 34. The Y-axis guide rails 34, the Y-axis movable table 36, the Y-axis ball screw 38, the Y-axis stepping motor 40, etc. jointly make up the Y-axis moving mechanism 32 for moving the Y-axis movable table 36 along the Y-axis guide rails 34. A Y-axis linear scale, not illustrated, for use in the detection of the position of the Y-axis movable table 36 in the Y-axis directions is disposed adjacent to and extends along one of the Y-axis guide rails 34. A reading head, not illustrated, is mounted on a lower surface of the Y-axis movable table 36 in facing relation to the Y-axis linear scale. When the Y-axis movable table 36 moves in one of the Y-axis directions along the Y-axis guide rails 34, the reading head reads graduations of the Y-axis linear scale for the calculation of the position or coordinate in the Y-axis directions of the Y-axis movable table 36 and the distance that the Y-axis movable table 36 has moved in the Y-axis directions.

Figure 6:
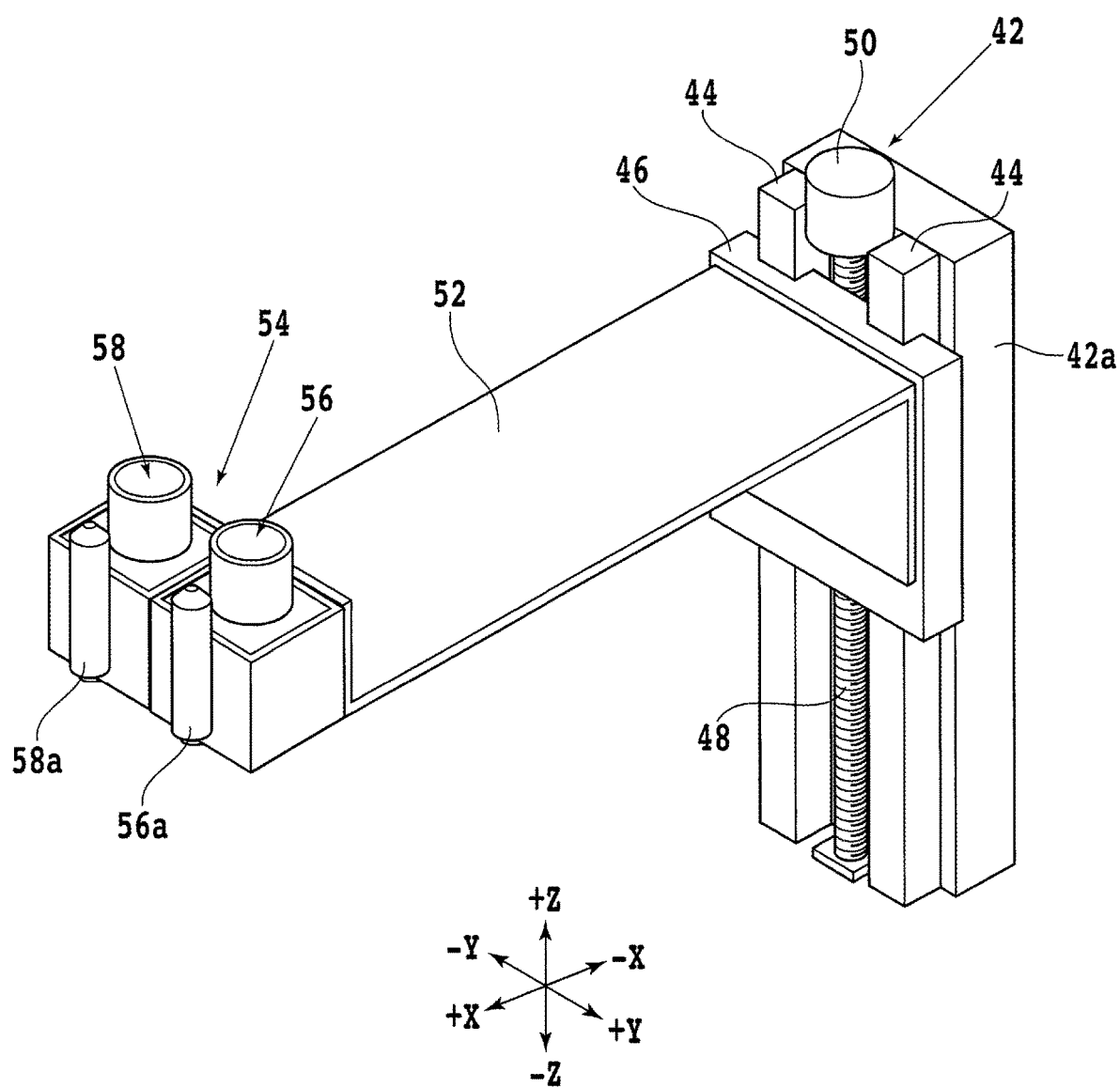
FIG. 6 is an enlarged perspective view of a lower image capturing unit of the cutting apparatus.

A Z-axis moving mechanism 42 is disposed on an upper surface of the Y-axis movable table 36. FIG. 6 illustrates the Z-axis moving mechanism 42 and other components in enlarged perspective. The Z-axis moving mechanism 42 has a support structure 42a fixed to the upper surface of the Y-axis movable table 36. A pair of Z-axis guide rails 44 that extend generally parallel to the Z-axis directions are fixed to a side surface of the support structure 42a that faces the X-axis movable table 18. A Z-axis movable plate 46 is slidable on and along the Z-axis guide rails 44. A nut, not illustrated, is mounted on a side surface of the Z-axis movable plate 46 that faces the support structure 42a and is operatively threaded over a Z-axis ball screw 48 disposed between and extending generally parallel to the Z-axis guide rails 44.

The Z-axis ball screw 48 has an end coupled to a Z-axis stepping motor 50. When the Z-axis stepping motor 50 is energized, it rotates the Z-axis ball screw 48 about its central axis, causing the nut to move the Z-axis movable plate 46 in one of the Z-axis directions along the Z-axis guide rails 44. The support structure 42a, the Z-axis guide rails 44, the Z-axis movable plate 46, the Z-axis ball screw 48, the Z-axis stepping motor 50, etc. jointly make up the Z-axis moving mechanism 42 for moving the Z-axis movable plate 46 along the Z-axis guide rails 44. A Z-axis linear scale, not illustrated, for use in the detection of the position of the Z-axis movable plate 46 in the Z-axis directions is disposed adjacent to and extends along one of the Z-axis guide rails 44. A reading head, not illustrated, is mounted on a side surface of the Z-axis movable plate 46 in facing relation to the Z-axis linear scale. When the Z-axis movable plate 46 moves in one of the Z-axis directions along the Z-axis guide rails 44, the reading head reads graduations of the Z-axis linear scale for the calculation of the position or coordinate in the Z-axis directions of the Z-axis movable plate 46 and the distance that the Z-axis movable plate 46 has moved in the Y-axis directions.

The lower image capturing unit, i.e., a second image capturing unit, 54 is fixed to the Z-axis movable plate 46 by a support arm 52 that is elongate in the X-axis directions. FIG. 6 is an enlarged perspective view of the lower image capturing unit 54. The lower image capturing unit 54 includes a microscopic camera unit that includes a low-magnification camera 56 and a high-magnification camera 58. Each of the low-magnification camera 56 and the high-magnification camera 58 includes an optical system having a condensing lens, etc., not illustrated, and an image capturing device such as a charge-coupled-device (CCD) image sensor or a complementary-metal-oxide-semiconductor (CMOS) image sensor, not illustrated.

According to the present embodiment, the image capturing device is capable of photoelectrically converting visible light into electric signals. The lower image capturing unit 54 is disposed in a position lower than the chuck table 10, and the condensing lenses have their optical axes substantially perpendicular to the other surface 12b of the holding member 12. An illuminating device 56a for applying visible light to a subject positioned above, e.g., the workpiece 11, is disposed alongside of the low-magnification camera 56. Similarly, an illuminating device 58a for applying visible light to a subject positioned above, i.e., the workpiece 11, is disposed alongside of the high-magnification camera 58. For capturing an image of the subject with the lower image capturing unit 54, the X-axis movable table 18 is moved toward the Y-axis movable table 36 until the lower image capturing unit 54 is placed in the space 18d in the X-axis movable table 18. Then, the lower image capturing unit 54 can capture an image of the face side 11a of the workpiece 11 placed on the surface 12a of the holding member 12 from below the holding member 12.

Other components of the cutting apparatus 2 will be described below with reference to FIG. 1. Bellows-shaped dust- and drip-resistant covers that are flexibly extensible and contractible are disposed in the opening 4b in covering relation thereto on respective left and right sides of the top plate 18c of the X-axis movable table 18 in the +X direction and the −X direction. A portal-shaped support structure 4c is mounted on an upper surface of the base 4 over and above the opening 4b. Two processing unit moving mechanisms, i.e., indexing feed units, incising feed units, 60 are disposed on a side surface of the support structure 4c that faces an opening 4a side of the base 4 in the −X direction. The processing unit moving mechanisms 60 share a pair of Y-axis guide rails 62 fixedly mounted on the side surface of the support structure 4c.

The Y-axis guide rails 62 extend generally parallel to the Y-axis directions. The processing unit moving mechanisms 60 include respective Y-axis moving plates 64 slidably on and along the Y-axis guide rails 62 independently of each other. Nuts, not illustrated, are mounted on respective surfaces of the Y-axis moving plates 64 that face the support structure 4c and are operatively threaded over respective Y-axis ball screws 66 disposed between and generally parallel to the Y-axis guide rails 62. Specifically, the nut mounted on one of the Y-axis moving plates 64 that is positioned forward in the +Y direction is operatively threaded over one of the Y-axis ball screws 66, whereas the nut mounted on the other Y-axis moving plate 64 that is positioned rearward in the −Y direction is operatively threaded over the other Y-axis ball screw 66.

The Y-axis ball screws 66 have respective ends coupled to respective Y-axis stepping motors 68 (one illustrated). When the Y-axis stepping motors 68 are energized, they rotate the respective Y-axis ball screws 66 about their central axes, causing the nuts to move the Y-axis moving plates 64 in the Y-axis directions along the Y-axis guide rails 62. The Y-axis moving plates 64 support on their surfaces facing away from the support structure 4c respective pairs of Z-axis guide rails 72 extending generally parallel to the Z-axis directions. A Z-axis moving plate 70a has a surface slidable on and along the pair of the Z-axis guide rails 72 on the other surface of the Y-axis moving plate 64 that is positioned rearward in the −Y direction. Similarly, a Z-axis moving plate 70b has a surface slidable on and along the pair of the Z-axis guide rails 72 on the other surface of the Y-axis moving plate 64 that is positioned forward in the +Y direction.

Nuts, not illustrated, are mounted on respective surfaces of the Z-axis moving plates 70a and 70b that face the support structure 4c, i.e., the Y-axis movable plates 64, and are operatively threaded over respective Z-axis ball screws 74 disposed between and generally parallel to the pairs of the Z-axis guide rails 72. The Z-axis ball screws 74 have respective ends coupled to respective Z-axis stepping motors 76. When the Z-axis stepping motors 76 are energized, they rotate the Z-axis ball screws 74 about their central axes, causing the nuts to move the Z-axis moving plates 70a and 70b in the Z-axis directions along the Z-axis guide rails 72.

A first cutting unit 78a is mounted on a lower portion of the Z-axis moving plate 70a that is positioned rearward in the −Y direction. The first cutting unit 78a includes a tubular spindle housing 80a in which a portion of a cylindrical spindle 82a (see FIG. 8) is rotatably housed. The spindle 82a has an end coupled to a rotating mechanism, not illustrated, such as a servomotor for rotating the spindle 82a about its central axis. A first cutting blade 84a having an annular cutting edge is mounted on the other end of the spindle 82a. The first cutting blade 84a according to the present embodiment is of the washer type, i.e., the hubless type, though it may be of the hub type.

An upper image capturing unit, i.e., a first image capturing unit, 86a is fixed to a lower portion of the Z-axis moving plate 70a. Therefore, the upper image capturing unit 86a is positionally fixed with respect to the first cutting unit 78a. The upper image capturing unit 86a is disposed upwardly of the chuck table 10. The upper image capturing unit 86a includes a microscopic camera unit having an optical system having a condensing lens etc., not illustrated, and an image capturing device capable of photoelectrically converting visible light into electric signals. The condensing lens has its optical axis substantially perpendicular to the surface 12a of the holding member 12.

Likewise, a second cutting unit 78b is mounted on a lower portion of the Z-axis moving plate 70b that is positioned forward in the +Y direction. The second cutting unit 78b includes a tubular spindle housing 80b in which a portion of a cylindrical spindle 82b (see FIG. 12) is rotatably housed. The spindle 82b has an end coupled to a rotating mechanism, not illustrated, such as a servomotor for rotating the spindle 82b about its central axis. A second cutting blade 84b having an annular cutting edge is mounted on the other end of the spindle 82b. The second cutting blade 84b according to the present embodiment is of the washer type, i.e., the hubless type, though it may be of the hub type.

The edge thickness, i.e., a second thickness, $84b_1$ (see FIG. 12) of the second cutting blade 84b is smaller than the edge thickness, i.e., a first thickness, $84a_1$ (see FIG. 8) of the first cutting blade 84a. Therefore, the width $13b_1$ of a second processed groove, i.e., a cut groove, 13b formed in the workpiece 11 by the second cutting blade 84b as it cuts the workpiece 11 is smaller than the width $13a_1$ of a first processed groove, i.e., a cut groove, 13a formed in the workpiece 11 by the first cutting blade 84a as it cuts the workpiece 11 (see FIGS. 12 and 13). An upper image capturing unit, i.e., a second image capturing unit, 86b is fixed to a lower portion of the Z-axis moving plate 70b. Therefore, the upper image capturing unit 86b is positionally fixed with respect to the second cutting unit 78b. The upper image capturing unit 86b is essentially identical in structure to the upper image capturing unit 86a.

As illustrated in FIG. 1, the base 4 also has an upwardly open opening 4d defined therein that has round shape and that is positioned behind the opening 4b in the −Y direction. The opening 4d houses therein a cleaning unit 90 for cleaning a workpiece 11, etc. after it has been cut with a cleaning liquid such as pure water. A casing, not illustrated, is disposed on the base 4. A touch panel 92 functioning as both an input panel and a display panel is mounted on a front side surface of the casing that faces in the +Y direction. The touch panel 92 displays images captured by the upper image capturing unit 86a and 86b and the lower image capturing unit 54.

Figure 10A:
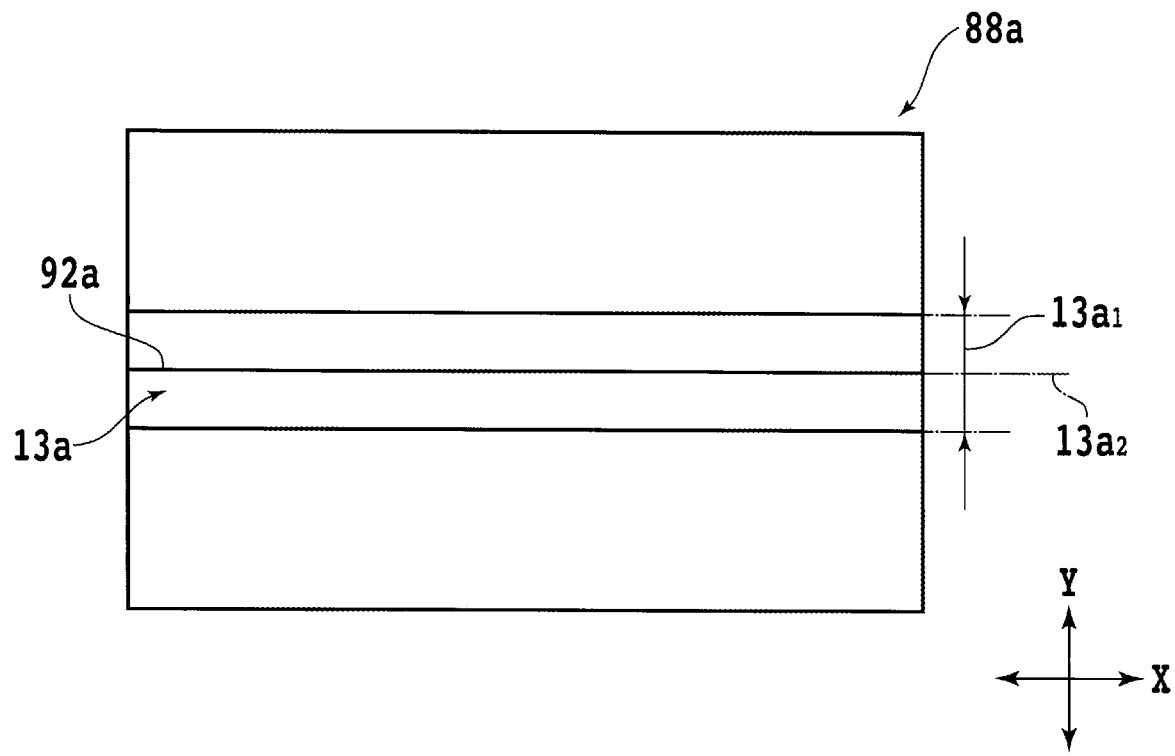
FIG. 10A is a view illustrating an example of an image including a first processed groove.
Figure 10B:
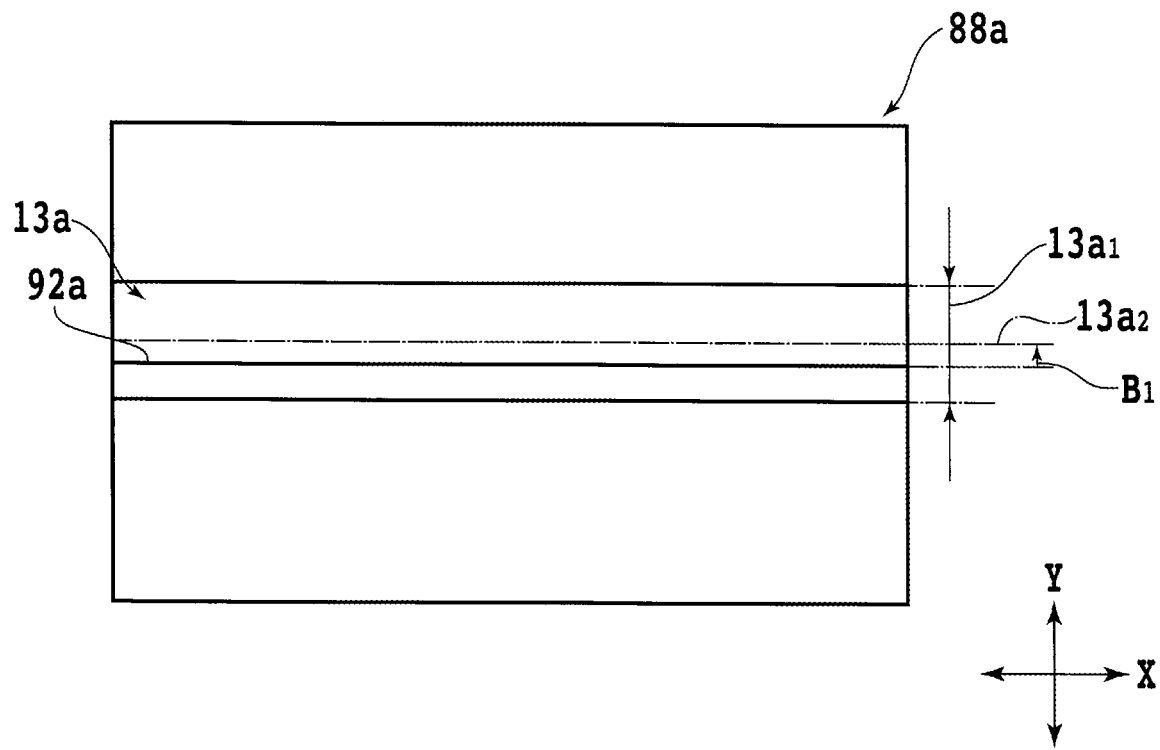
FIG. 10B is a view illustrating another example of an image including a first processed groove.

As illustrated in FIGS. 10A and 10B, the touch panel 92 displays an image 88a captured by the upper image capturing unit 86a and a reference line 92a of the upper image capturing unit 86a that is generated by image processing. The reference line 92a is a straight line extending across the center of the image capturing area of the upper image capturing unit 86a and generally parallel to the X-axis directions. The upper image capturing unit 86a functions as an eye, i.e., visual means, for confirming an area of the workpiece 11 to be actually cut by the first cutting unit 78a. The reference line 92a corresponds to a line representing a target position where a first central line $13a_2$ (see FIG. 8) of the first processed groove 13a exists.

Figure 14A:
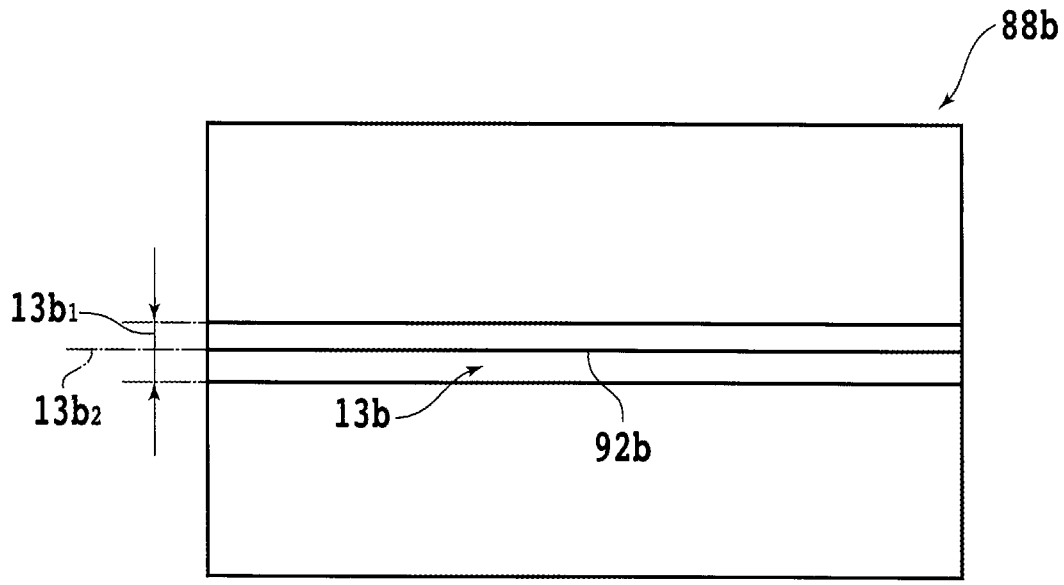
FIG. 14A is a view illustrating an example of an image including a second processed groove.
Figure 14B:
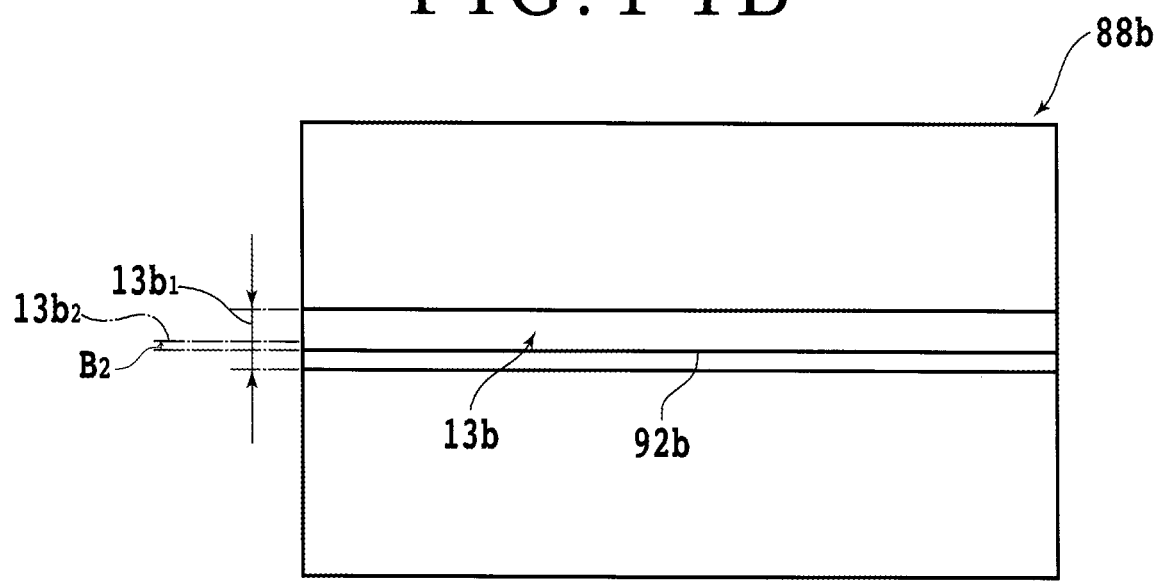
FIG. 14B is a view illustrating another example of an image including a second processed groove.

Similarly, as illustrated in FIGS. 14A and 14B, the touch panel 92 displays an image 88b captured by the lower image capturing unit 54 and a reference line 92b of the lower image capturing unit 54 that is generated by image processing. As with the reference line 92a, the reference line 92b is a straight line extending across the center of the image capturing area of the lower image capturing unit 54 and generally parallel to the X-axis directions. The lower image capturing unit 54 also functions as an eye, i.e., visual means, for confirming an area of the workpiece 11 to be actually cut by the second cutting unit 78b. The reference line 92b corresponds to a line representing a target position where a second central line $13b_2$ (see FIG. 12) of the second processed groove 13b exists. The upper image capturing unit 86a and the lower image capturing unit 54 have respective origin positions preset in conformity with each other. Therefore, the reference line 92a and the reference line 92b are also preset in conformity with each other and do not deviate from each other.

The touch panel 92 displays processing conditions, a graphical user interface (GUI), etc. as well as the images captured by the upper image capturing units 86a and 86b and the lower image capturing unit 54. The cutting apparatus 2 includes a controller 94 (see FIG. 1) for controlling the touch panel 92 etc. Specifically, the controller 94 controls, in addition to the touch panel 92, the suction source 14, the X-axis moving mechanism 26, the rotary actuator 30, the Y-axis moving mechanism 32, the Z-axis moving mechanism 42, the lower image capturing unit 54, the processing unit moving mechanisms 60, the first cutting unit 78a, the second cutting unit 78b, the upper image capturing units 86a and 86b, etc.

The controller 94 includes a computer including a processing device such as a processor typified by a central processing unit (CPU) and a storage device 96. The storage device 96 has a main storage unit such as a dynamic random access memory (DRAM), a static random accessor memory (SRAM), or a read only memory (ROM), and an auxiliary storage unit such as a flash memory, a hard disk drive, or a solid state drive. The auxiliary storage unit stores software including predetermined programs. The controller 94 has its functions performed when the processing device runs the software stored in the auxiliary storage unit. A cutting method, i.e., a processing method, for cutting a workpiece 11 according to a stepwise cutting process using the cutting apparatus 2 will be described below.

Figure 7:
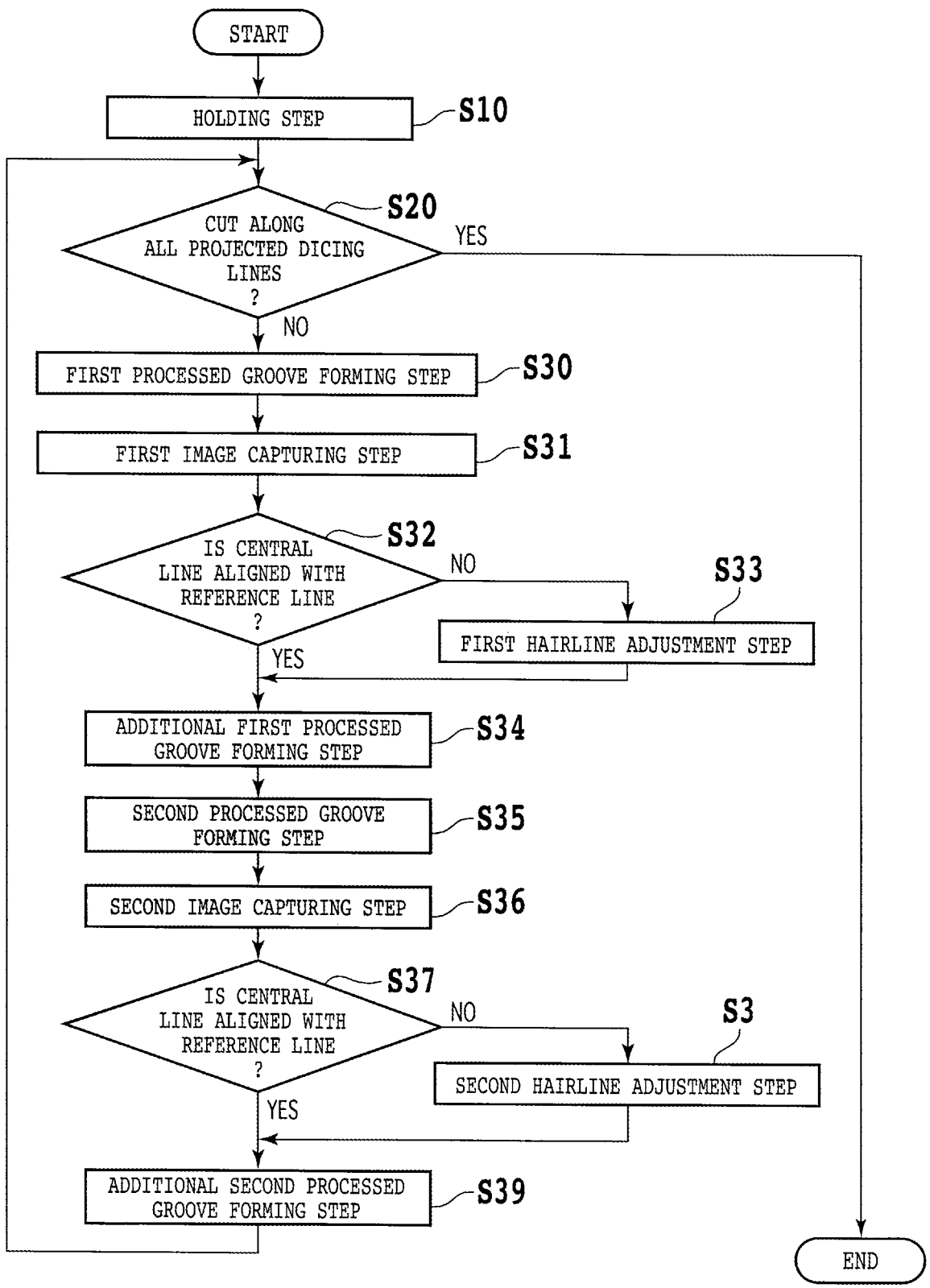
FIG. 7 is a flowchart of the processing sequence of a cutting method according to a first embodiment of the present invention as the method of processing a workpiece.

FIG. 7 is a flowchart of the processing sequence of a cutting method according to a first embodiment of the present invention. For cutting the workpiece 11, the face side 11a is held under tension on the chuck table 10 with the tape 17 interposed therebetween while the reverse side 11b is being exposed upwardly (holding step S10). After holding step S10, if the workpiece 11 has not been cut along all the projected dicing lines 13 that extends along a first direction (NO in step S20), then processed grooves, i.e., first processed grooves 13a and second processed grooves 13b, are successively formed in the workpiece 11 by the first cutting blade 84a and the second cutting blade 84b (processed groove forming step).

Figure 8:
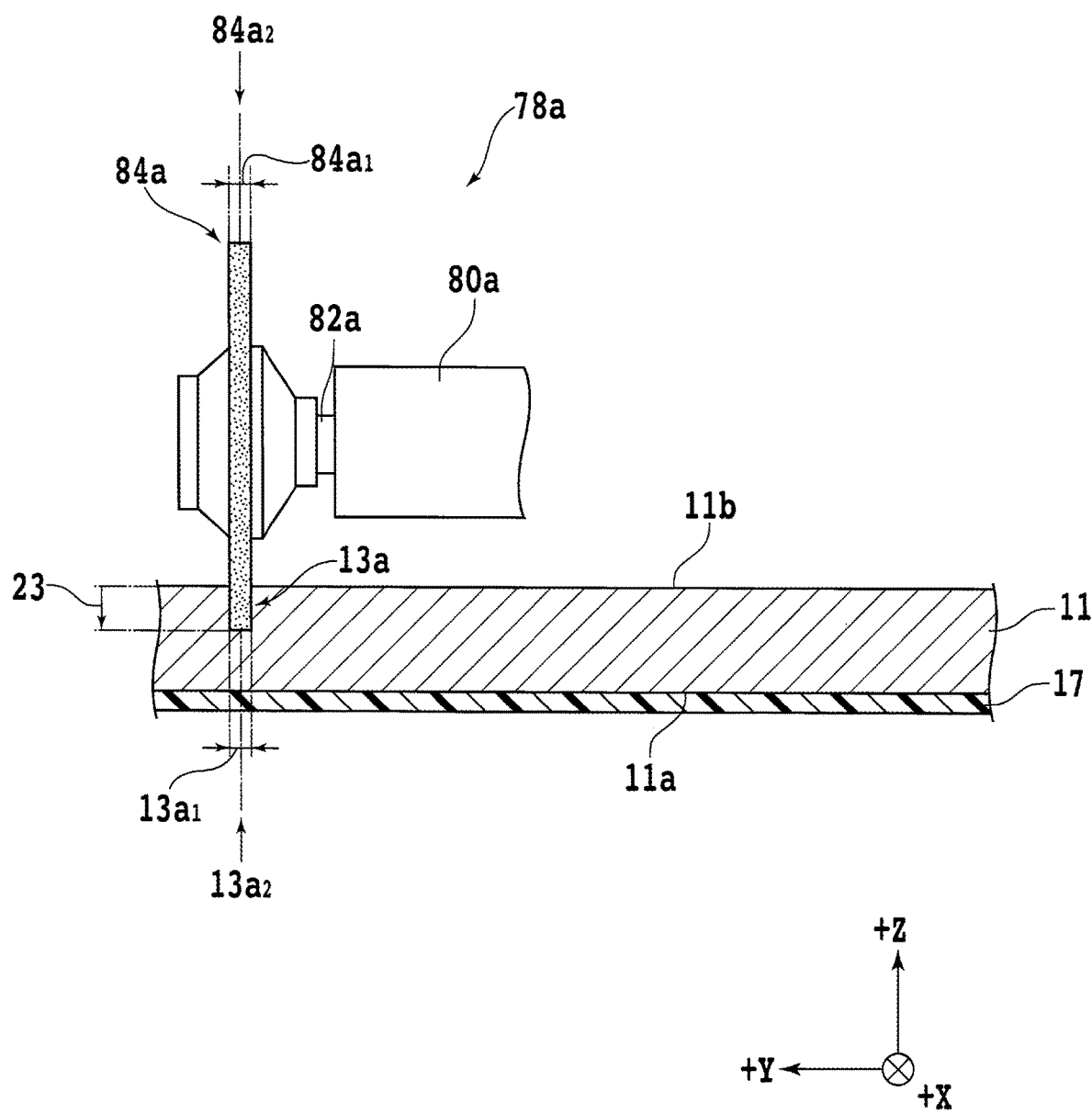
FIG. 8 is a cross-sectional view illustrating a first processed groove forming step of the cutting method.

The processed groove forming step according to the present embodiment includes steps S30 through S39 to be described later. In the processed groove forming step, the lower image capturing unit 54 captures an image of the face side 11a of the workpiece 11, and an alignment process is performed on the workpiece 11 on the basis of the captured image. Then, the rotary actuator 30 is energized to bring the projected dicing lines 13 substantially parallel to the X-axis directions, i.e., an angular alignment process is performed on the workpiece 11. Thereafter, first processed groove forming step S30 is carried out. FIG. 8 illustrates first processed groove forming step S30 in cross section. In first processed groove forming step S30, a first cutting position is designated to place the first cutting blade 84a on an extension of one projected dicing line 13 and to position the lower end of the first cutting blade 84a at a predetermined depth 23 between the face side 11a and the reverse side 11b. Then, the X-axis movable table 18 is processing-fed to cause the first cutting blade 84a to form a first processed groove 13a, i.e., a half-cut groove, in the workpiece 11 to the predetermined depth 23 that terminates short of the face side 11a. The depth 23 is not limited to one half of the thickness of the workpiece 11, but may be adjusted to any of various depths depending on the workpiece 11.

Figure 9:
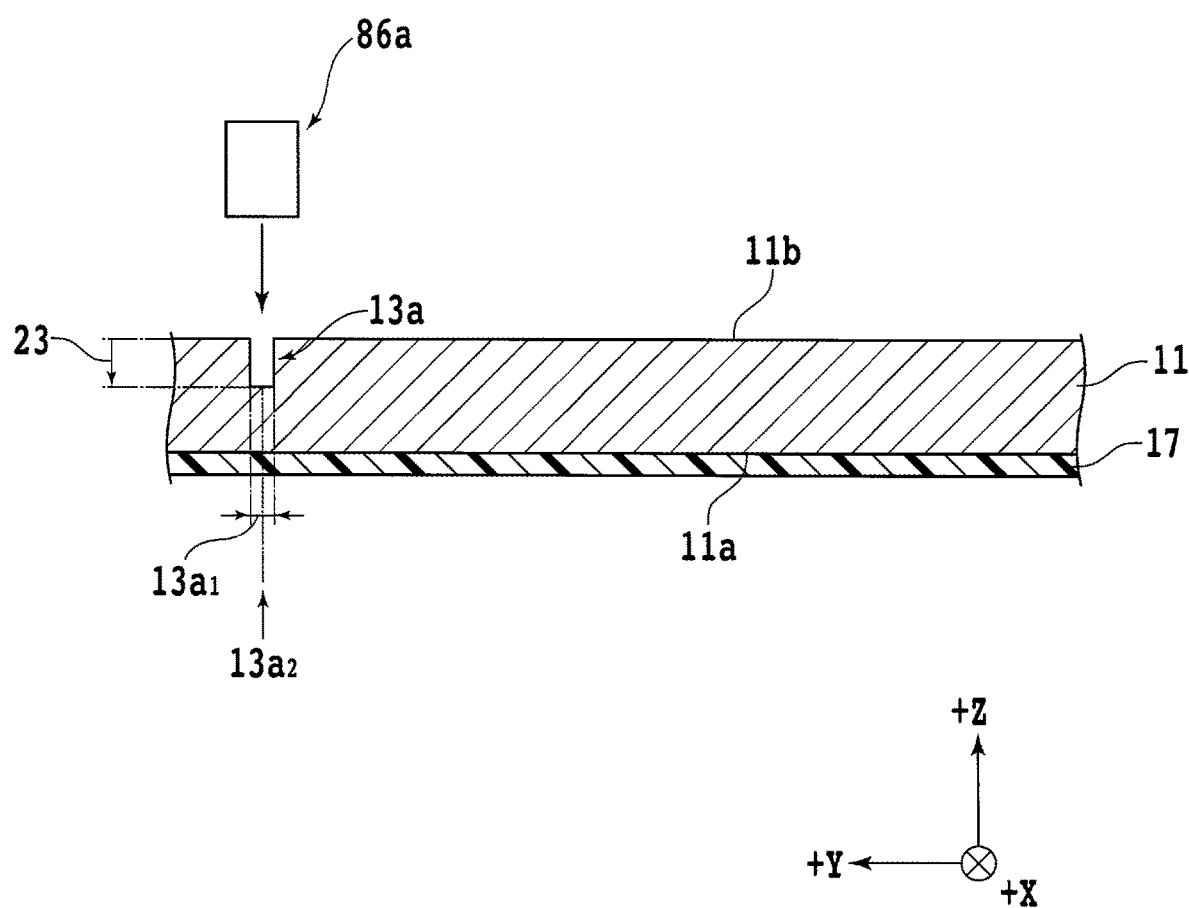
FIG. 9 is a cross-sectional view illustrating a first image capturing step of the cutting method.

After the first processed groove 13a has been formed in the workpiece 11, the upper image capturing unit 86a captures, with visible light, an image of the first processed groove 13a that is exposed on the reverse side 11b (first image capturing step S31). FIG. 9 illustrates first image capturing step S31 of the cutting method in cross section. After first image capturing step S31, the controller 94 detects a deviation of the first central line $13a_2$ of the first processed groove 13a from the reference line 92a (first kerf checking step S32). The first central line $13a_2$ is positioned at the widthwise center of the first processed groove 13a and extends substantially parallel to the X-axis directions. The first central line $13a_2$ corresponds substantially to a widthwise center $84a_2$ (see FIG. 8) of the cutting edge of the first cutting blade 84a when the first cutting blade 84a cuts the workpiece 11 to form the first processed groove 13a in the workpiece 11.

FIG. 10A illustrates an example of an image including the first processed groove 13a. In FIG. 10A, the first central line $13a_2$ and the reference line 92a are positionally aligned with each other in the Y-axis directions. In this case, i.e., in a case of YES in step S32, control goes to additional first processed groove forming step S34.

Before the workpiece 11 is cut, a process of aligning the first central line $13a_2$ and the reference line 92a with each other, i.e., a hairline adjustment process, is carried out using a mirror wafer or the like. Therefore, the first central line $13a_2$ and the reference line 92a are normally aligned with each other before the workpiece 11 is cut. However, in a case where the workpiece 11 is made of a hard material or is relatively thick, or the direction along which the workpiece 11 is cut is inclined to a direction tangential to a point on the outer circumferential edge of the workpiece 11, the first central line $13a_2$ may deviate from the reference line 92a.

FIG. 10B illustrates another example of an image including the first processed groove 13a. In FIG. 10B, a deviational distance by which and a deviational direction in which the first central line $13a_2$ deviates from the reference line 92a in the Y-axis directions are indicated by a vector $B_1$. If the deviational distance is larger than a predetermined threshold value, e.g., 5 μm, in first kerf checking step S32, then the controller 94 produces an alarm sound from a speaker, not illustrated, or displays an alarm message on the touch panel 92, prompting an operator to perform the hairline adjustment process.

The operator operates the touch panel 92 to actuate the corresponding processing unit moving mechanism 60 while viewing the image 88a, moving the upper image capturing unit 86a in one of the Y-axis directions to bring the reference line 92a into alignment with the first central line $13a_2$ (first hairline adjustment step S33). For performing a highly accurate cutting process, the operator may confirm the image 88a and carry out first hairline adjustment step S33, if necessary, regardless of whether or not there is an alarm in first kerf checking step S32.

On the basis of a distance by which and a direction in which the upper image capturing unit 86a is moved in first hairline adjustment step S33, the controller 94 detects a deviational distance and deviational direction of the upper image capturing unit 86a, i.e., the vector $B_1$ illustrated in FIG. 10B, and stores the detected deviational distance and deviational direction in the storage device 96. When the first cutting blade 84a cuts the workpiece 11 after first hairline adjustment step S33, the controller 94 corrects the position of the center $84a_2$ of the first cutting blade 84a in order to cancel out the deviational distance and deviational direction.

Figure 11:
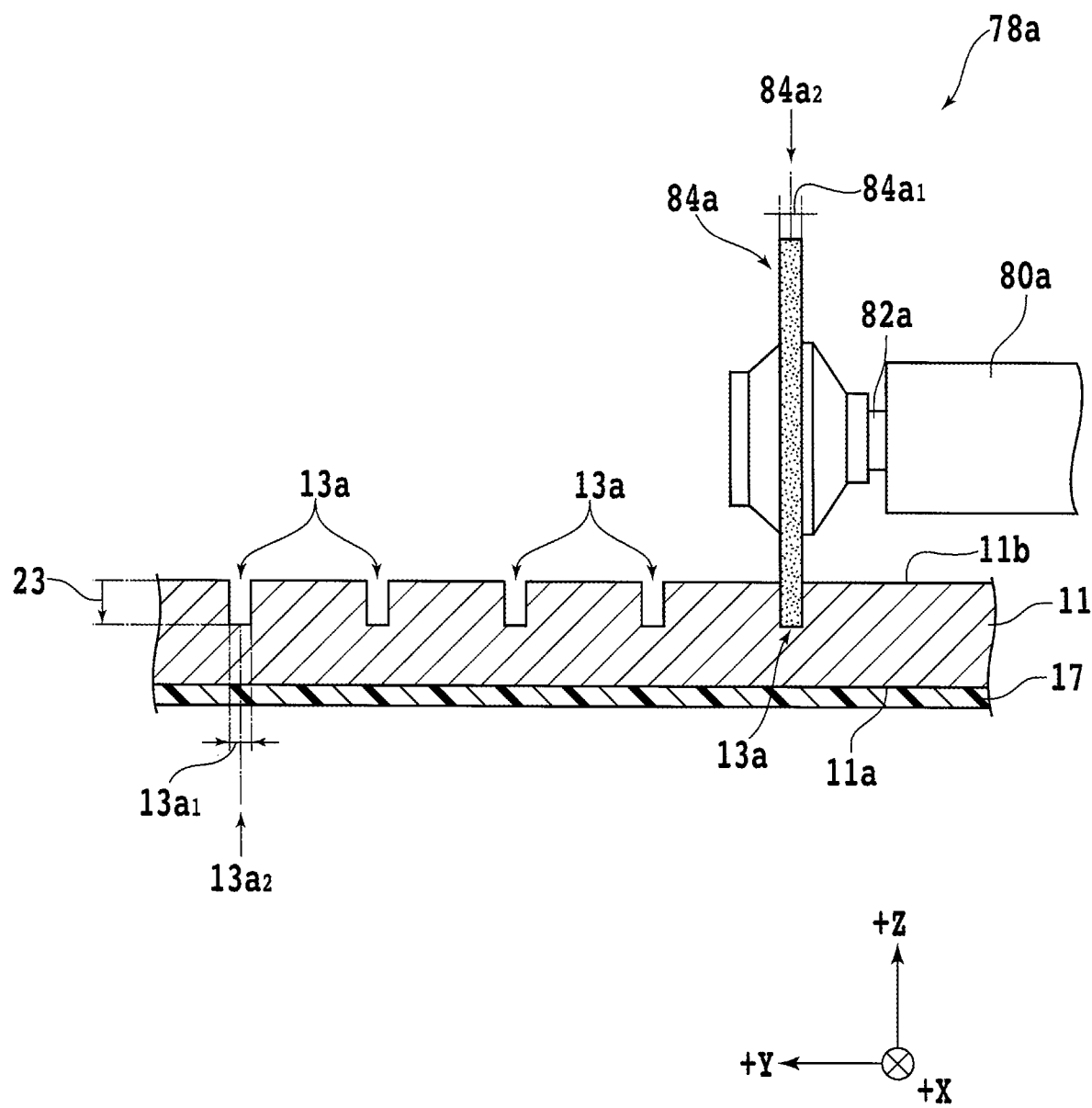
FIG. 11 is a cross-sectional view illustrating an additional first image capturing step of the cutting method.

In additional first processed groove forming step S34, the first cutting units 78a is indexing-fed by a predetermined street pitch. The first cutting blade 84a is thus positioned on an adjacent projected dicing line 13 and similarly forms a first processed groove 13a in the workpiece 11. In additional first processed groove forming step S34, a plurality of, or specifically four, first processed grooves 13a are formed in the workpiece 11. FIG. 11 illustrates additional first processed groove forming step S34 in cross section. In this manner, five first processed grooves 13a are formed in the workpiece 11 in steps S30 through S34.

Figure 12:
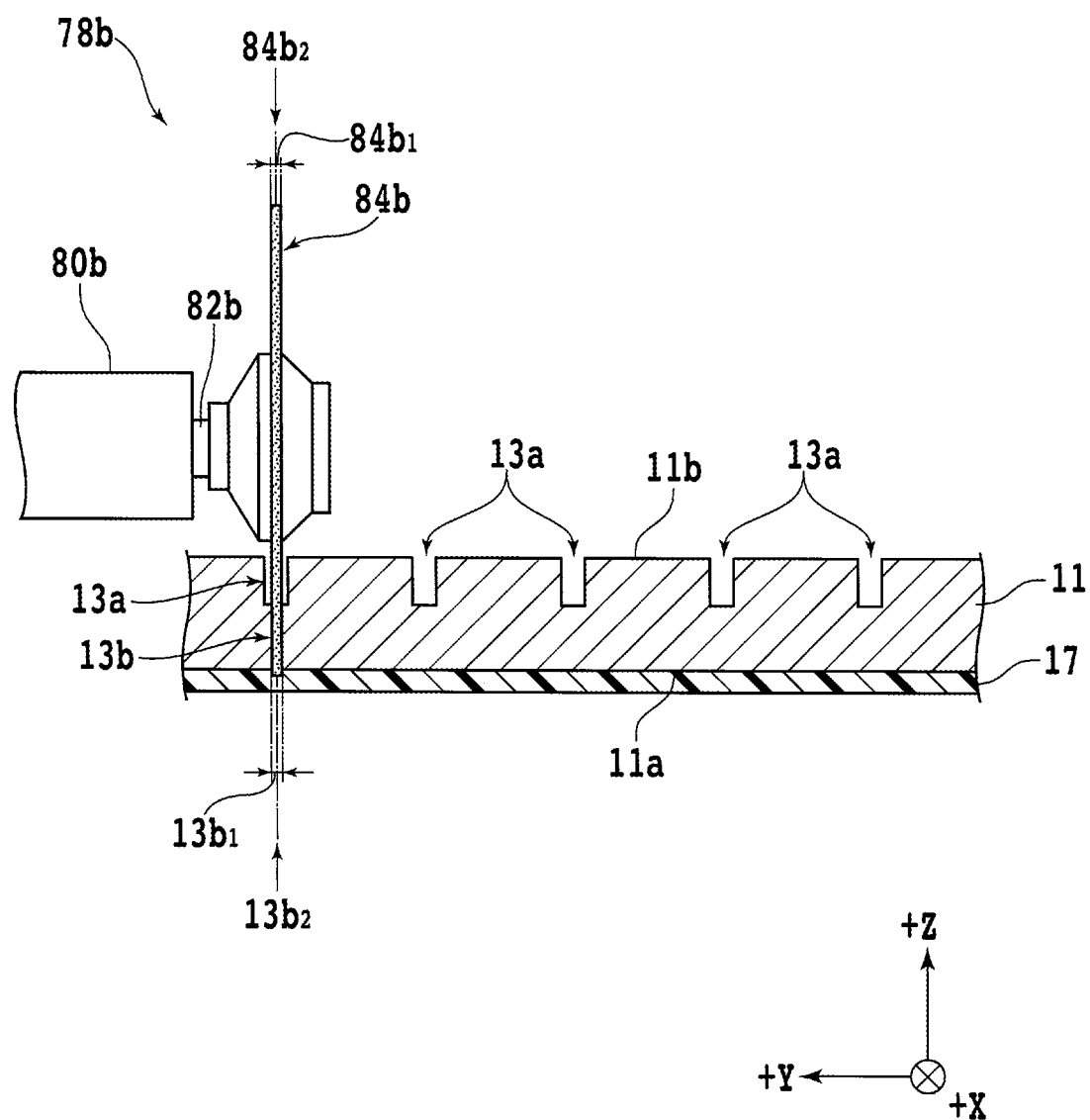
FIG. 12 is a cross-sectional view illustrating a second image capturing step of the cutting method.

After additional first processed groove forming step S34, a second cutting position corresponding to the first cutting position is designated to place the second cutting blade 84b on an extension of the first processed groove 13a formed in first processed groove forming step S30 and to position the lower end of the second cutting blade 84b that is rotating at a high speed between the face side 11a and the surface 12a. Then, the X-axis movable table 18 is processing-fed, thereby forming a second processed groove 13b that extends to the face side 11a (second processed groove forming step S35). FIG. 12 illustrates second processed groove forming step S35 in cross section. In second processed groove forming step S35, the workpiece 11 is divided along one first processed groove 13a and one second processed groove 13b. After second processed groove forming step S35, the lower image capturing unit 54, e.g., the high-magnification camera 58 and the illuminating device 58a, captures an image of the second processed groove 13b formed in the face side 11a with visible light through the chuck table 10 (second image capturing step S36).

Figure 13:
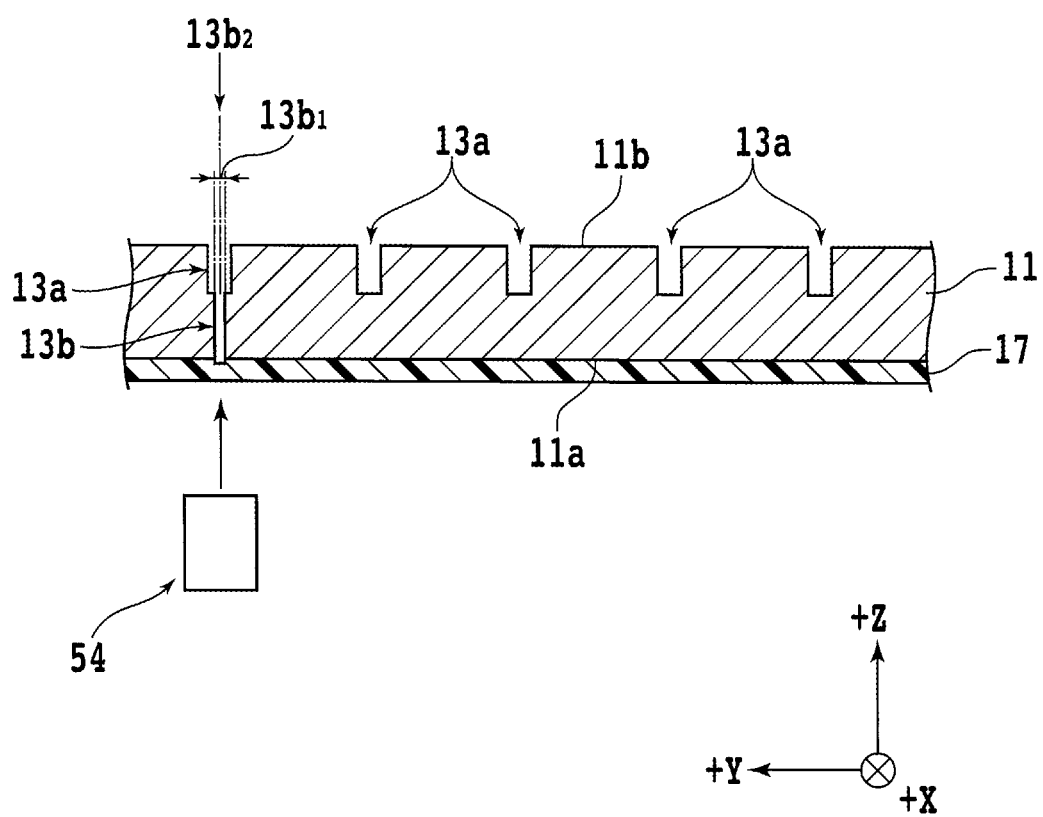
FIG. 13 is a cross-sectional view illustrating a second image capturing step of the cutting method.

FIG. 13 illustrates second image capturing step S36 in cross section. According to the present embodiment, since the lower image capturing unit 54, rather than the upper image capturing units 86a and 86b, captures an image of the second processed groove 13b, it is possible to capture an image of the second processed groove 13b without fail. After second image capturing step S36, the controller 94 detects a deviation of the second central line $13b_2$ of the second processed groove 13b from the reference line 92b (second kerf checking step S37). The second central line $13b_2$ is positioned at the widthwise center of the second processed groove 13b and extends substantially parallel to the X-axis directions. The second central line $13b_2$ corresponds substantially to a widthwise center $84b_2$ (see FIG. 12) of the cutting edge of the second cutting blade 84b when the second cutting blade 84b cuts the workpiece 11 to form the second processed groove 13b in the workpiece 11. FIG. 14A illustrates an example of an image including the second processed groove 13b. In FIG. 14A, the second central line $13b_2$ and the reference line 92b are positionally aligned with each other in the Y-axis directions. In this case, i.e., in a case of YES in step S37, control goes to additional second processed groove forming step S39.

The second central line $13b_2$ and the reference line 92b are normally aligned with each other. However, in a case where the workpiece 11 is made of a hard material or for other reasons as described above, the second central line $13b_2$ may deviate from the reference line 92b. FIG. 14B illustrates another example of an image including the second processed groove 13b. In FIG. 14B, a deviational distance by which and a deviational direction in which the second central line $13b_2$ deviates from the reference line 92b in the Y-axis directions are indicated by a vector $B_2$.

If the deviational distance is larger than a predetermined threshold value, e.g., 5 μm, in second kerf checking step S37, then the controller 94 produces an alarm, prompting the operator to perform the hairline adjustment process. The operator operates the touch panel 92 to actuate the corresponding processing unit moving mechanism 60 while viewing the image 88b, moving the lower image capturing unit 54 in one of the Y-axis directions to bring the reference line 92b into alignment with the second central line $13b_2$ (second hairline adjustment step S38). For performing a highly accurate cutting process, the operator may confirm the image 88b and carry out second hairline adjustment step S38, if necessary, regardless of whether or not there is an alarm in second kerf checking step S37.

On the basis of a distance by which and a direction in which the lower image capturing unit 54 is moved in second hairline adjustment step S38, the controller 94 detects a deviational distance and deviational direction of the lower image capturing unit 54, i.e., the vector $B_2$ illustrated in FIG. 14B, and stores the detected deviational distance and deviational direction in the storage device 96. When the second cutting blade 84b cuts the workpiece 11 after second hairline adjustment step S38, the controller 94 corrects the position of the center $84b_2$ of the second cutting blade 84b in order to cancel out the deviational distance and deviational direction.

According to the present embodiment, first kerf checking step S32 and second kerf checking step S37 are collectively referred to as a detecting step. In the detecting step, it is possible to detect whether or not the position of the first central line $13a_2$ obtained in first image capturing step S31 and the position of the second central line $13b_2$ obtained in second image capturing step S36 are in conformity with each other in an X-Y plane, i.e., a predetermined plane. In a case where at least one of first hairline adjustment step S33 and second hairline adjustment step S38 is carried out, it is determined that the first central line $13a_2$ and the second central line $13b_2$ are not in conformity with each other in the detecting step. According to the present embodiment, moreover, first hairline adjustment step S33 and second hairline adjustment step S38, each carried out if necessary, are collectively referred to as a correcting step. When the correcting step is carried out, the center $84a_2$ of the first cutting blade 84a across the edge thickness $84a_1$ thereof and the center 84b₂ of the second cutting blade 84b across the edge thickness 84b₁ thereof are brought into conformity with each other.

Figure 15:
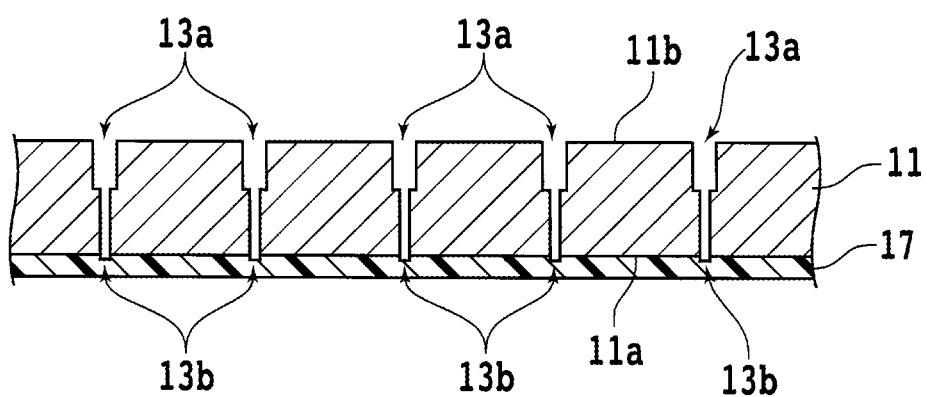
FIG. 15 is a cross-sectional view of a workpiece after an additional second processed groove forming step of the cutting method has been carried out.

After step S37 or steps S37 and S38, second processed grooves 13b are similarly formed in the workpiece 11 respectively beneath the remaining four first processed grooves 13a (additional second processed groove forming step S39). FIG. 15 illustrates in cross section the workpiece 11 after additional second processed groove forming step S39 has been carried out.

Control then goes back to step S20. In a case of NO in step S20, then the steps from first processed groove forming step S30 to additional second processed groove forming step S39 are carried out again. In this manner, the workpiece 11 is cut along all the projected dicing lines 13 along the first direction, after which the chuck table 10 is turned 90 degrees about its central axis. Then, the workpiece 11 is similarly cut along all the projected dicing lines 13 that extend along a second direction perpendicular to the first direction. After the workpiece 11 has been cut along all the projected dicing lines 13 that extend along the first direction and the second direction (YES in step S20), the overall cutting process comes to an end.

According to the first embodiment, if the position of the first central line 13a₂ and the position of the second central line 13b₂ are not in conformity with each other in the X-Y plane, then at least one of the position of the center 84a₂ of the first cutting blade 84a and the center 84b₂ of the second cutting blade 84b is corrected in order to bring the position of the first central line 13a₂ and the position of the second central line 13b₂ into conformity with each other in the correcting step, i.e., steps S33 and S38. Therefore, when the workpiece 11 is cut after the correcting step, the first central line 13a₂ of the first processed groove 13a on the reverse side 11b and the second central line 13b2 of the second processed groove 13b on the face side 11a are kept in conformity with each other. The cutting process is particularly effective when the workpiece 11 is cut stepwise.

(First modification) In first processed groove forming step S30, only one first processed groove 13a, rather than a plurality of first processed grooves 13a, may be formed in the workpiece 11. The first processed grooves 13a may be formed not in a device region where the devices 15 are formed, but in an outer circumferential extra region existing around the device region.

(Second modification) According to the first embodiment, the edge thickness 84b₁ of the second cutting blade 84b is smaller than the edge thickness 84a₁ of the first cutting blade 84a. However, the edge thickness 84b₁ may be the same as the edge thickness 84a₁.

Figure 16A:
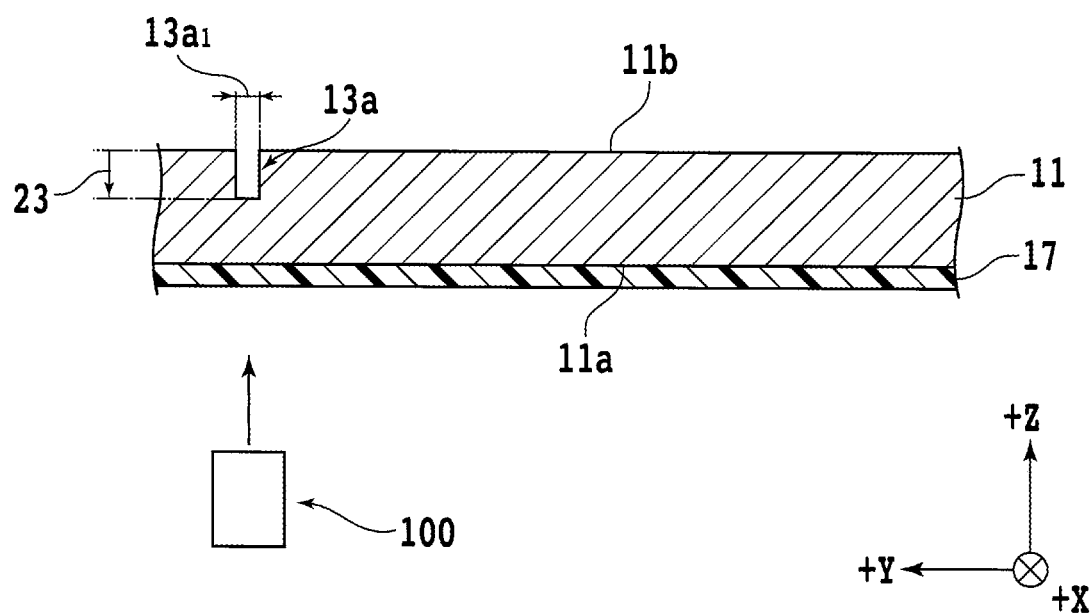
FIG. 16A is a cross-sectional view illustrating a first image capturing step of a cutting method according to a second embodiment of the present invention.
Figure 16B:
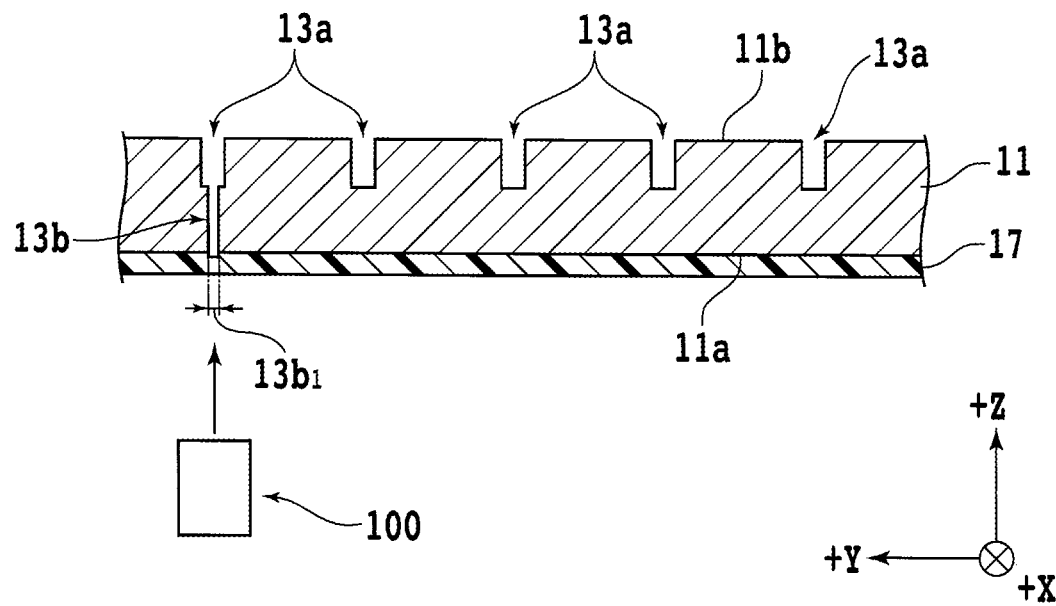
FIG. 16B is a cross-sectional view illustrating a second image capturing step of the cutting method according to the second embodiment.

(Second embodiment) A second embodiment of the present invention will be described below with reference to FIGS. 16A and 16B. A cutting apparatus 2 according to the second embodiment has a lower image capturing unit, i.e., a third image capturing unit, 100 (see FIGS. 16A and 16B) capable of capturing an image of the workpiece 11 with infrared radiation, rather than the lower image capturing unit 54. The lower image capturing unit 100 also includes a microscopic camera unit that includes a low-magnification camera and a high-magnification camera. Each of the cameras has an image capturing device capable of photoelectrically converting infrared radiation into electric signals. Each of the cameras is combined with an illuminating device ancillary thereto for applying infrared rays, e.g., near infrared rays.

According to the second embodiment, the cutting apparatus 2 also cuts the workpiece 11 according to the processing sequence illustrated in FIG. 7. However, the second embodiment is different from the first embodiment in that both first image capturing step S31 and second image capturing step S36 are carried out using the lower image capturing unit 100. FIG. 16A illustrates, in cross section, first image capturing step S31 of a cutting method according to the second embodiment. In first image capturing step S31, the image capturing device captures an image of the first processed groove 13a formed in the reverse side 11b with infrared radiation while the high-magnification camera is focused on the reverse side 11b through the chuck table 10. FIG. 16B illustrates, in cross section, second image capturing step S36 of the cutting method according to the second embodiment. In second image capturing step S36, the image capturing device captures an image of the second processed groove 13b formed in the face side 11a with infrared radiation while the high-magnification camera is focused on the face side 11a through the chuck table 10.

According to the second embodiment, as with the first embodiment, even if the first central line 13a2 and the second central line 13b₂ deviate from each other, the first central line 13a₂ of the first processed groove 13a on the reverse side 11b and the second central line 13b₂ of the second processed groove 13b on the face side 11a can be brought into conformity with each other when the workpiece 11 is cut after the correcting step. Structural details, method details, and other details according to the above embodiments of the present invention may be appropriately changed or modified without departing from the scope of the invention. The modifications described above of the first embodiment may be applied to the second embodiment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a semiconductor wafer having devices formed on a face side of the wafer, comprising:
   a holding step of holding the face side of the wafer on a holding table having a region made of a transparent material while a reverse side of the wafer is being exposed; and
   a processed groove forming step of forming a processed groove in the wafer by cutting the wafer held on the holding table with a cutting blade, wherein
   the processed groove forming step includes:
      a first processed groove forming step of forming a first processed groove in the wafer, the first processed groove having a predetermined depth short of the face side, with a first cutting blade having a first thickness,
      a first image capturing step of capturing an image of the first processed groove on the reverse side of the wafer by a first image capturing unit, the first capturing unit being disposed on a first side of the holding table,
      a second processed groove forming step of positioning a second cutting blade that has a second thickness at the first processed groove and forming a second processed groove in the wafer along the first processed groove, the second processed groove extending to the face side, thereby dividing the wafer,
      a second image capturing step of capturing an image of the second processed groove on the face side of the wafer through the holding table by a second image capturing unit, the second image capturing unit being disposed on a second, opposite side of the holding table, and a detecting step of detecting whether or not a position of a first central line of the first processed groove whose image has been captured in the first image capturing step and a position of a second central line of the second processed groove whose image has been captured in the second image capturing step are in conformity with each other in a predetermined plane, and if the position of the first central line and the position of the second central line are not in conformity with each other in the predetermined plane in the detecting step, then the processed groove forming step further has a correcting step of correcting a position of a center of the cutting blade in order to bring the position of the first central line and the position of the second central line into conformity with each other.

2. The method of processing a wafer according to claim 1, wherein
the second cutting blade is smaller in edge thickness than the first cutting blade.

3. The method of processing a wafer according to claim 1, wherein
the first image capturing step includes capturing an image of the first processed groove on the reverse side with visible light using a first image capturing unit disposed above the wafer,
the second image capturing step includes capturing an image of the second processed groove on the face side with visible light through the holding table using a second image capturing unit disposed below the wafer, and
the detecting step includes detecting whether or not a position of a first central line of the first processed groove on the reverse side and a position of a second central line of the second processed groove on the face side are in conformity with each other in the predetermined plane.

4. A method of processing a semiconductor wafer having devices formed on a face side of the wafer, comprising:
a holding step of holding the face side of the wafer on a holding table having a region made of a transparent material while a reverse side of the wafer is being exposed; and
a processed groove forming step of forming a processed groove in the wafer by cutting the wafer held on the holding table with a cutting blade, wherein
the processed groove forming step includes:
a first processed groove forming step of forming a first processed groove in the wafer, the first processed groove having a predetermined depth short of the face side, with a first cutting blade having a first thickness,
a first image capturing step of capturing an image of the first processed groove on the reverse side with infrared radiation through the holding table using a third an image capturing unit disposed below the wafer,
a second processed groove forming step of positioning a second cutting blade that has a second thickness at the first processed groove and forming a second processed groove in the wafer along the first processed groove, the second processed groove extending to the face side, thereby dividing the wafer,
a second image capturing step of capturing an image of the second processed groove on the face side with infrared radiation through the holding table using the third image capturing unit, and
a detecting step of detecting whether or not a position of a first central line of the first processed groove on the reverse side whose image has been captured in the first image capturing step and a position of a second central line of the second processed groove on the face side whose image has been captured in the second image capturing step are in conformity with each other in the predetermined plane, and if the position of the first central line and the position of the second central line are not in conformity with each other in the predetermined plane in the detecting step, then the processed groove forming step further has a correcting step of correcting a position of a center of the cutting blade in order to bring the position of the first central line and the position of the second central line into conformity with each other.

5. The method of processing a wafer according to claim 1, wherein in the processed groove forming step, the cutting blades cuts into the wafer from the reverse side of the wafer.

6. A method of processing a workpiece, comprising:
a holding step of holding a face side of the workpiece on a holding table having a region made of a transparent material while a reverse side of the workpiece is being exposed; and
a first processed groove forming step of forming a first processed groove in the workpiece by cutting the workpiece held on the holding table with a first cutting blade, wherein the first cutting blade cuts into the wafer from the reverse side of the wafer, wherein
the first processed groove forming step includes:
a first image capturing step of capturing an image of the first processed groove on the reverse side of the workpiece,
a first detecting step of detecting whether or not a position of a first central line of the first processed groove whose image has been captured in the first image capturing step and a position of a first reference line are in conformity with each other in a predetermined plane, the first reference line representing a target position for the first central line,
determining the position of the first central line and the position of the first reference line are not in conformity with each other in the predetermined plane in the first detecting step,
a first correcting step of correcting a position of a center of the first cutting blade in order to bring the position of the first central line and the position of the first reference line into conformity with each other,
a second processed groove forming step of forming a second processed groove in the workpiece by cutting the workpiece held on the holding table with a second cutting blade, wherein the second cutting blade cuts into the wafer from the reverse side of the wafer, wherein
the second processed groove forming step includes:
a second image capturing step of capturing an image of the second processed groove on the face side of the workpiece through the holding table, and
a second detecting step of detecting whether or not a position of a second central line of the second processed groove whose image has been captured in the second image capturing step and a position of a second reference line are in conformity with each other in a predetermined plane, the second reference line representing a target position for the second central line, and determining the position of the second central line and the position of the second reference line are not in conformity with each other in the predetermined plane in the detecting step, a second correcting step of correcting a position of a center of the second cutting blade in order to bring the position of the second central line and the position of the second reference line into conformity with each other.

7. The method of processing a workpiece according to claim 6, wherein the first processed groove has a predetermined depth short of the face side, with the first cutting blade having a first thickness, and the second processed groove forming step includes positioning the second cutting blade that has a second thickness at the first processed groove and forming the second processed groove in the workpiece along the first processed groove, the second processed groove extending to the face side, thereby dividing the workpiece.

8. The method of processing a workpiece according to claim 7, wherein the second cutting blade is smaller in edge thickness than the first cutting blade.

9. The method of processing a workpiece according to claim 7, wherein the first image capturing step includes capturing an image of the first processed groove on the reverse side with visible light using a first image capturing unit disposed above the workpiece, and the second image capturing step includes capturing an image of the second processed groove on the face side with visible light through the holding table using a second image capturing unit disposed below the workpiece.

10. The method of processing a workpiece according to claim 7, wherein the first image capturing step includes capturing an image of the first processed groove on the reverse side with infrared radiation through the holding table using an image capturing unit disposed below the workpiece, and the second image capturing step includes capturing an image of the second processed groove on the face side with infrared radiation through the holding table using the image capturing unit.

\* \* \* \* \*

UNITED STATES PATENT AND TRADEMARK OFFICE
CERTIFICATE OF CORRECTION

| | | |
|---|---|---|
| PATENT NO. | : 12,076,879 B2 | Page 1 of 1 |
| APPLICATION NO. | : 17/649123 | |
| DATED | : September 3, 2024 | |
| INVENTOR(S) | : Kojima et al. | |

It is certified that error appears in the above-identified patent and that said Letters Patent is hereby corrected as shown below:

In the Claims

Column 17, Line 58, Claim 4, delete "a third".

Column 18, Line 2, Claim 4, delete "third".

Column 18, Line 20, Claim 5, after "wafer" insert -- workpiece --.

Signed and Sealed this
Third Day of December, 2024

*Katherine Kelly Vidal*

Katherine Kelly Vidal
*Director of the United States Patent and Trademark Office*